(12) United States Patent
Kim et al.

(10) Patent No.: US 11,805,625 B2
(45) Date of Patent: Oct. 31, 2023

(54) INSULATING HEAT DISSIPATION COATING COMPOSITION AND INSULATING HEAT DISSIPATION UNIT FORMED USING THE SAME

(71) Applicant: AMOGREENTECH CO., LTD., Gyeonggi-do (KR)

(72) Inventors: Moon Hoe Kim, Gyeonggi-do (KR); Seung Jae Hwang, Incheon (KR); Moon Young Hwang, Incheon (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 1358 days.

(21) Appl. No.: 16/303,566

(22) PCT Filed: May 24, 2017

(86) PCT No.: PCT/KR2017/005427
§ 371 (c)(1),
(2) Date: Nov. 20, 2018

(87) PCT Pub. No.: WO2017/204565
PCT Pub. Date: Nov. 30, 2017

(65) Prior Publication Data
US 2020/0154608 A1 May 14, 2020

(30) Foreign Application Priority Data
May 24, 2016 (KR) .................. 10-2016-0063683

(51) Int. Cl.
*H05K 7/20* (2006.01)
*C09D 163/00* (2006.01)
(Continued)

(52) U.S. Cl.
CPC ....... *H05K 7/20427* (2013.01); *C08G 59/245* (2013.01); *C08G 59/42* (2013.01);
(Continued)

(58) Field of Classification Search
CPC .............. C09D 163/00–10; C08K 3/34; C08K 2003/382; C08K 2003/385; C08K 3/14;
(Continued)

(56) References Cited

U.S. PATENT DOCUMENTS 3,360,391 A * 12/1967 Manfred .............. C09D 163/00
523/440
6,265,074 B1 * 7/2001 Shah ....................... B43L 1/002
156/278

(Continued)

FOREIGN PATENT DOCUMENTS

CN 101580626 A * 11/2009
JP 2010-526907 A 8/2010
(Continued)

OTHER PUBLICATIONS

Partial machine translation of CN-101580626-A (2009).*
(Continued)

*Primary Examiner* — Kregg T Brooks
(74) *Attorney, Agent, or Firm* — Rothwell, Figg, Ernst & Manbeck, P.C.

(57) ABSTRACT

An insulating heat dissipation coating composition including a coating layer-forming component including a subject resin, and an insulating heat dissipation filler. Therefore, the coating composition may have excellent thermal conductivity and excellent thermal emissivity, and therefore an insulating heat dissipation coating layer which exhibits excellent heat dissipation performance and has insulating property may be formed. In addition, the heat dissipation coating layer formed thereby has a very excellent adhesive strength to a surface to be coated so as to significantly prevent peeling of the coating layer during use, and to maintain durability of the coating layer even against a physical or chemical stimulus such as external heat, organic solvent, moisture or shock, which is generated after the coating layer is formed.

4 Claims, 7 Drawing Sheets

(51) Int. Cl.
   *C08G 59/50* (2006.01)
   *C08G 59/42* (2006.01)
   *C08G 59/24* (2006.01)
   *C08K 3/34* (2006.01)
   *C08G 59/58* (2006.01)
   *C08K 3/14* (2006.01)
   *C08K 5/17* (2006.01)

(52) U.S. Cl.
   CPC ........... *C08G 59/502* (2013.01); *C08G 59/58* (2013.01); *C08K 3/34* (2013.01); *C09D 163/00* (2013.01); *C08K 3/14* (2013.01); *C08K 5/17* (2013.01)

(58) Field of Classification Search
   CPC ...... C08G 59/502; C08G 59/42; C08G 59/58; C08G 59/245; C08G 59/50–5026; C08G 59/5033
   See application file for complete search history.

(56) References Cited

U.S. PATENT DOCUMENTS

| | | | | |
|---|---|---|---|---|
| 8,933,157 | B2* | 1/2015 | Meneghetti | C01B 21/064 524/404 |
| 9,441,069 | B2 | 9/2016 | Arita et al. | |
| 11,250,986 | B2* | 2/2022 | Hwang | H01F 27/28 |
| 2009/0156715 | A1* | 6/2009 | Dueber | C08L 63/00 524/415 |
| 2009/0298965 | A1* | 12/2009 | Kimura | C08K 3/14 522/146 |
| 2010/0197848 | A1* | 8/2010 | Verghese | C08J 3/24 524/502 |
| 2011/0079929 | A1* | 4/2011 | Matsuda | H01L 23/3135 257/E23.116 |
| 2019/0111763 | A1* | 4/2019 | Lim | F24H 9/1872 |
| 2021/0284850 | A1* | 9/2021 | Lee | C09D 7/69 |

FOREIGN PATENT DOCUMENTS

| | | |
|---|---|---|
| JP | 2010-535278 A | 11/2010 |
| JP | 2011-500950 A | 1/2011 |
| JP | 2012-526163 A | 10/2012 |
| KR | 10-2010-0100911 A | 9/2010 |
| KR | 20120076881 A | 7/2012 |
| KR | 20140128354 A | 11/2014 |

OTHER PUBLICATIONS

International Search Report cited in PCT/KR2017/05427 dated Aug. 29, 2017, 3 pages.

Korean Office Action dated May 18, 2023 issued in the corresponding Korean Patent Application No. 10-2016-0063683, 8 pages.

* cited by examiner

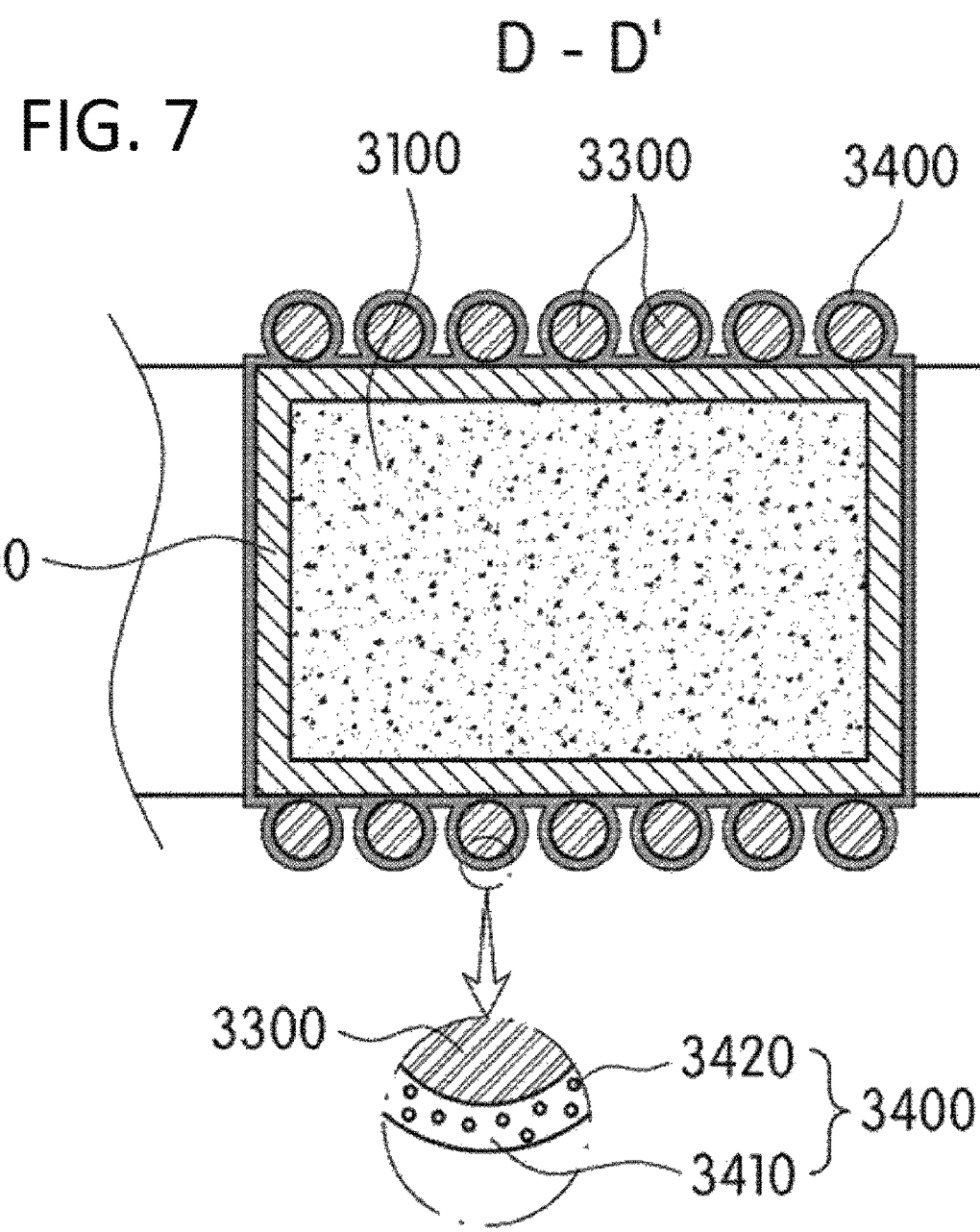

INSULATING HEAT DISSIPATION COATING COMPOSITION AND INSULATING HEAT DISSIPATION UNIT FORMED USING THE SAME

CROSS REFERENCE TO RELATED APPLICATION

This application is a 35 U.S.C. 371 National Phase Entry Application from PCT/KR2017/005427, filed May 24, 2017, which claims the benefit of Korean Patent Application No. 10-2016-0063683 filed on May 24, 2016, the disclosures of which are incorporated herein in their entirety by reference.

TECHNICAL FIELD

The present invention relates to an insulating heat dissipation coating composition, and more particularly, to an insulating heat dissipation coating composition which exhibits both a heat dissipation property and an insulating property and an insulating heat dissipation unit coated therewith.

BACKGROUND ART

Generally, a heat dissipation member is mounted on a heat-generating part to prevent malfunctions caused by heat generated in various parts included in a device during use of an electronic device. A heat dissipation member such as a heat dissipation plate or a heat sink is for rapidly emitting heat in a device or part to the outside using a metal conventionally having thermal conductivity.

In one example, as the heat sink, a structure in which a plurality of heat dissipation fins uniformly extruding are arranged on an entire surface by an extrusion molding method using a mold having a predetermined shape after aluminum, copper or an alloy thereof is heated and melted at a high temperature has been usually employed.

Recently, there have been attempts to enhance heat dissipation performance by forming a heat dissipation coating layer on a heat dissipation member.

However, many types of fillers, which are in a heat dissipation coating layer, for enhancing heat dissipation performance also have conductivity, and in this case, they have difficulty in being used in applications requiring both heat dissipation and electrical insulation.

In addition, although an insulating heat dissipation coating layer has both an insulating property and a heat dissipation property, it is difficult to attain all physical properties of the formed insulating heat dissipation coating layer, for example, durability, heat dissipation performance and an adhesive strength to a surface to be coated, and there is a serious problem with the surface quality of the insulating heat dissipation coating layer, for example, an uneven or filler-protruding surface of the insulating heat dissipation coating layer.

Further, heat dissipation coating layers which have been known to have an excellent heat dissipation property have a problem of difficult thermal emission to the outside of the layers because they have excellent thermal conductivity in the layers, but have low thermal emissivity at an interface between the heat dissipation coating layer and an air layer.

For this reason, there is an urgent demand for researching compositions for forming an insulating heat dissipation coating layer capable of realizing an insulating heat dissipation coating layer, which can have an excellent adhesive strength to a surface to be coated, excellent durability against an external physical or chemical stimulus such as heat/moisture/organic solvent, an excellent surface quality of the coating layer, significantly enhance both an insulating property and heat dissipation performance, and have, particularly, excellent thermal emissivity.

DISCLOSURE

Technical Problem

To address the above-described problems, the present invention is directed to providing an insulating heat dissipation coating composition, which can implement a coating layer expressing excellent heat dissipation performance due to excellent thermal conductivity and an excellent thermal emissivity.

In addition, the present invention is also directed to providing an insulating heat dissipation coating composition which can implement a coating layer having direct contact with various types of electronic parts or devices requiring heat dissipation due to a heat dissipation property and insulating property.

In addition, the present invention is also directed to providing an insulating heat dissipation coating composition which has a very excellent adhesive strength to a surface to be coated to significantly prevent the insulating heat dissipation coating layer from being peeled during use, and maintain durability of the coating layer even against a physical or chemical stimulus such as external heat, organic solvent, moisture or shock after being formed as an insulating heat dissipation coating layer.

Furthermore, the present invention is also directed to providing an insulating heat dissipation coating composition which can implement an insulating heat dissipation coating layer because the layer has a very smooth surface and an excellent leveling property, thereby exhibiting excellent surface quality.

Moreover, the present invention is also directed to providing a heat dissipation unit to which an insulating heat dissipation coating composition according to the present invention, which has excellent physical properties as described above, is applied.

Technical Solution

To attain the above objects, the present invention provides an insulating heat dissipation coating composition, which includes a coating layer-forming component containing a subject resin, and an insulating heat dissipation filler.

According to an exemplary embodiment of the present invention, the subject resin may include one or more types selected from the group consisting of polyethylene, polypropylene, polystyrene, polyvinyl chloride, a polyacrylonitrile resin, acrylonitrile-butadiene-styrene (ABS), styrene-acrylonitrile (SAN), an acrylic resin, a methacrylic resin, a polyamide, polyester, a polycarbonate, polyphenylene sulfide, a polyamideimide, polyvinylbutyral, polyvinylformal, polyhydroxypolyether, a polyether, polyphthalamide, a phenoxy resin, polyurethane, a nitrile butadiene resin, an urea-based resin (UF), a melamine-based resin (MF), a unsaturated polyester resin (UP), an epoxy resin and a silicone resin.

In addition, the subject resin is a curable resin, and the coating layer-forming component may further include a curing agent at 25 to 100 parts by weight with respect to 100 parts by weight of the subject resin. In addition, the curing agent preferably includes one or more types selected from the group consisting of an aliphatic polyamine-based curing agent, an aromatic polyamine-based curing agent, an acid anhydride-based curing agent and a catalytic curing agent. The curing agent more preferably includes a first curing agent including an aliphatic polyamine-based curing agent and a second curing agent including one or more types selected from the group consisting of an aromatic polyamine-based curing agent, an acid anhydride-based curing agent and a catalytic curing agent at a weight ratio of 1:0.5 to 1.5. The aliphatic polyamine-based curing agent may include a polyethylene polyamine.

In addition, the insulating heat dissipation filler may be included at 25 to 70 parts by weight with respect to 100 parts by weight of the subject resin.

In addition, the insulating heat dissipation filler preferably includes one or more types selected from the group consisting of magnesium oxide, titanium dioxide, aluminum nitride, silicon nitride, boron nitride, aluminum oxide, silica, zinc oxide, barium titanate, strontium titanate, beryllium oxide, silicon carbide and manganese oxide, and more preferably includes silicon carbide.

In addition, the subject resin may include a compound represented by Formula 1 below.

described above to determine thermal emissivity according to Mathematical Formula 1 below.

[Mathematical Formula 1]

Thermal emissivity (%) =

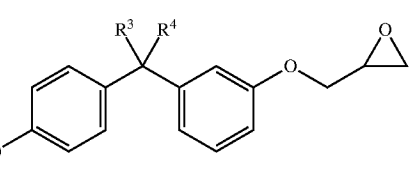

(%)

Meanwhile, the present invention provides an insulating heat dissipation unit, which includes: a heat dissipation member or a supporting member; and an insulating heat dissipation coating layer formed by treating at least a part of the outer surface of the heat dissipation member or support-

[Formula 1]

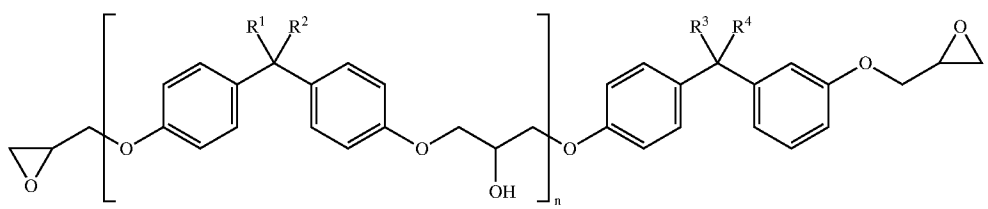

$R^1$ and $R^2$ are each independently a hydrogen atom, a C1 to C5 linear alkyl group or a C3 to C5 branched alkyl group, $R^3$ and $R^4$ are each independently a hydrogen atom, a C1 to C5 linear alkyl group or a C3 to C5 branched alkyl group, and n is a rational number such that the compound represented by Formula 1 has a weight average molecular weight of 400 to 4000.

In addition, the insulating heat dissipation filler may have an average particle diameter of 10 nm to 15 µm.

In addition, the insulating heat dissipation filler may have a ratio of D50 to D97 of 1:4.5 or less.

In addition, the insulating heat dissipation coating composition may further include 10 to 60 parts by weight of a pigment with respect to 100 parts by weight of the subject resin.

In addition, thermal emissivity according to an evaluation method to be described below may be 30% or more.

[Method of Evaluating Thermal Emission]

In a closed system at 25° C. and a humidity of 50%, a heat dissipation unit including an insulating heat dissipation coating layer having a thickness of 25 µm, formed by treatment with an insulating heat dissipation coating composition was placed on a top surface of an aluminum plate with a thickness of 1.5 mm and a size of width×length of 35 mm×34 mm to have a surface area in the middle of the bottom of the dissipation unit of 4 cm², and to be closely adhered to a heat source at 88° C., and after 90 minutes, a temperature was measured at the site 5 cm above the center of the heat dissipation unit, and a temperature was measured only on an aluminum plate on which a heat dissipation coating layer was not formed by the same method as ing member with the insulating heat dissipation coating composition according to the present invention.

According to an exemplary embodiment of the present invention, the insulating heat dissipation coating layer may have a thickness of 15 to 50 µm.

In addition, the insulating heat dissipation unit may have a resistance value per unit area of $10^{10}$ to $10^{14}$ Ω/sq.

Advantageous Effects

Since an insulating heat dissipation coating composition of the present invention has excellent thermal conductivity and an excellent thermal emissivity, it can form an insulating heat dissipation coating layer which has excellent heat dissipation performance and insulating property. In addition, the insulating heat dissipation coating layer formed thereby has a very high adhesive strength to a surface to be coated such that peeling of the insulating heat dissipation coating layer can be significantly prevented during use, and durability of the insulating heat dissipation coating layer even against a physical or chemical stimulus such as external heat, an organic solvent, moisture or shock after the insulating heat dissipation coating layer is formed can be maintained. In addition, since a heat dissipation filler dispersed in the formed insulating heat dissipation coating layer has excellent dispersibility, uniform insulation and heat dissipation performance can be exhibited. Further, since the formed insulating heat dissipation coating layer has a very smooth surface, an excellent leveling property, and an excellent surface quality, the insulating heat dissipation coating composition can be widely applied in all industries requiring both insulation and heat dissipation.

DESCRIPTION OF DRAWINGS

FIGS. 6 and 7 are a perspective view and a partial cross-sectional view of coil part including an insulating heat dissipation unit according to an exemplary embodiment of the present invention.

MODES OF THE INVENTION

Figure 1:
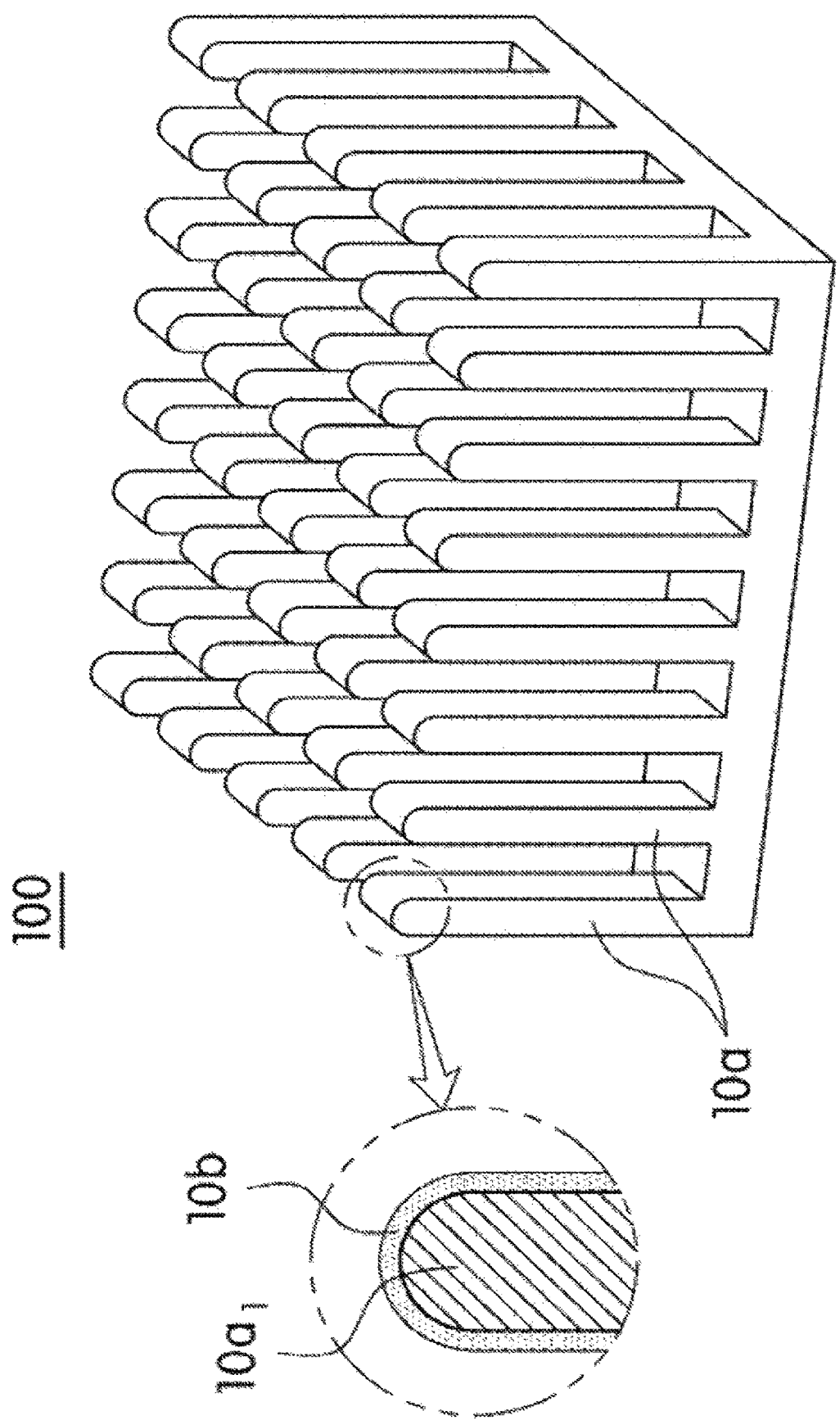
FIGS. 1 to 3 are perspective views and a partial cross-sectional view of an insulating heat dissipation unit according to an exemplary embodiment of the present invention.

Hereinafter, embodiments of the present invention will be described in detail with reference to the accompanying drawings so that those of ordinary skill in the art can easily carry out the present invention. The present invention may be implemented in a variety of different forms, and is not limited to the embodiments described herein.

The insulating heat dissipation coating composition according to an exemplary embodiment of the present invention includes: a coating layer-forming component including a subject resin; and an insulating heat dissipation filler.

The coating layer-forming component may include a subject resin, and further include a curing agent when the subject resin is a curable resin.

The subject resin can be used without limitation as long as it is a component known in the art and forms a coating layer. However, to achieve an adhesive strength to a base to be coated, thermal resistance which is not deteriorated by heat generated from a heat-generating base, insulating property which is not deteriorated by an electrical stimulus, and improved heat dissipation performance due to improvement in mechanical strength and compatibility with an insulating heat dissipation filler, the subject resin may include one type selected from the group consisting of polyethylene, polypropylene, polystyrene, polyvinylchloride, a polyacrylonitrile resin, acrylonitrile-butadiene-styrene (ABS), styrene acrylonitrile (SAN), an acrylic resin, a methacrylic resin, a polyamide, polyester, a polycarbonate, polyphenylene sulfide, a polyamideimide, polyvinylbutyral, polyvinylformal, polyhydroxypolyether, a polyether, polyphthalamide, a phenoxy resin, polyurethane, a nitrile butadiene resin, an urea-based resin (UF), a melamine-based resin (MF), an unsaturated polyester resin (UP), a silicone resin and an epoxy resin, a mixture thereof or a copolymer thereof. In one example, the subject resin may be an acryl melamine-based resin. A specific type corresponding to each resin may be a resin known in the art, and thus details thereof will be omitted in the present invention.

In one example, when the resin is an epoxy resin, the subject resin may include any one or more epoxy resins selected from the group consisting of a glycidyl ether-type epoxy resin, a glycidyl amine-type epoxy resin, a glycidyl ester-type epoxy resin, a linear aliphatic epoxy resin, a rubber-modified epoxy resin and a derivative thereof.

Specifically, the glycidyl ether-type epoxy resin may include phenol-based glycidyl ethers and alcohol-based glycidyl ethers, and the phenol-based glycidyl ethers may include bisphenol-based epoxy resins such as bisphenol A type, bisphenol B type, bisphenol AD type, bisphenol S type, bisphenol F type and resorcinol, phenol-based novolac resins such as phenol novolac epoxy, aralkylphenol novolac, terphenephenol novolac, and cresolnovolac-based epoxy resins such as o-cresolnovolac epoxy, and may be used independently or in combination of two or more types thereof.

The glycidyl amine-type epoxy resins may include diglycidylaniline, tetraglycidyldiaminodiphenylmethane, N,N,N',N'-tetraglycidyl-m-xylenediamine, 1,3-bis(diglycidylaminomethyl)cyclohexane, and triglycidyl-m-aminophenol, triglycidly-p-aminophenol including both structures of a glycidyl ether and glycidyl amine, and may be used independently or in combination of two or more types thereof.

The glycidyl ester-type epoxy resins may include epoxy resins made from hydroxycarbonic acids such as p-hydroxybenzoic acid and -hydroxynaphthoic acid, and polycarbonic acids such as phthalic acid and terephthalic acid, and may be used independently or in combination of two or more types thereof.

The linear aliphatic epoxy resins may include glycidyl ethers made from 1,4-butanediol, 1,6-hexanediol, neopentyl glycol, cyclohexanedimethanol, glycerine, trimethylolethane, trimethylol propane, pentaerythritol, dodecahydro bisphenol A, dodecahydro bisphenol F, ethylene glycol, propylene glycol, polyethylene glycol, and polypropylene glycol, and may be used independently or in combination of two or more types thereof.

The rubber-modified epoxy resin is not particularly limited as long as it is an epoxy resin having rubber and/or polyester in a backbone, and as an example, may be a rubber-modified epoxy resin such as an epoxy resin which is chemically bonded with an carboxyl-modified butadiene-acrylonitrile elastomer in a molecule (CTBN-modified epoxy resin), an acrylonitrile-butadiene rubber-modified epoxy resin (NBR-modified epoxy resin), an urethane-modified epoxy resin, or a silicone-modified epoxy resin, and may be used independently or in combination of two or more types thereof.

However, in terms of improved heat dissipation property and durability of the insulating heat dissipation coating layer due to very high compatibility with insulating heat dissipation fillers to be described, and particularly, silicon carbide, improved surface quality of the insulating heat dissipation coating layer and improved dispersibility of the heat dissipation filler, as an example, the subject resin may include a compound represented by Formula 1 below.

[Formula 1]

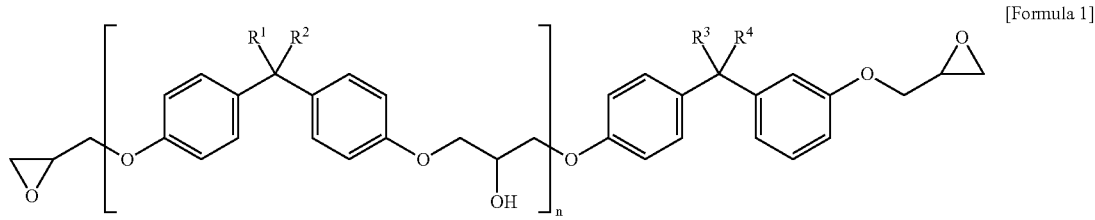

$R^1$ and $R^2$ are each independently a hydrogen atom, a C1 to C5 linear alkyl group or a C3 to C5 branched alkyl group, and preferably a hydrogen atom, a C1 to C3 linear alkyl group or a C3 to C4 branched alkyl group, $R^3$ and $R^4$ are each independently a hydrogen atom, a C1 to C5 linear alkyl group or a C3 to C5 branched alkyl group, and preferably a hydrogen atom, a C1 to C3 linear alkyl group or a C3 to C4 branched alkyl group, and n is a rational number such that the compound represented by Formula 1 has a weight average molecular weight of 400 to 4000, and preferably 450 to 3900.

If the compound represented by Formula 1 has a weight average molecular weight of less than 400, due to increased flowability of the coating composition, it may be difficult to produce an insulating heat dissipation coating layer and then an adhesive strength to a surface to be coated may be reduced, and if the compound represented by Formula 1 has a weight average molecular weight of more than 4000, it may be difficult to produce an insulating heat dissipation coating layer to a uniform thickness, and due to reduced dispersibility of the heat dissipation filler in the coating composition, it may be difficult to express uniform insulation and heat dissipation performance when the insulating heat dissipation coating layer is formed.

In addition, a curing agent included in the coating layer-forming component along with an epoxy resin that can be used as the above-described subject resin may vary depending on a specific type of selected epoxy, and specifically, a curing agent known in the art may be used, and preferably includes any one or more components among an aliphatic polyamine-based curing agent, an aromatic polyamine-based curing agent, an acid anhydride-based curing agent and a catalytic curing agent.

Specifically, the aliphatic polyamine-based curing agent may include, for example, polyethyleneamines, and preferably includes one or more types selected from the group consisting of diethylene triamine (DETA), diethyl aminopropylamine (DEAPA), triethylene tetramine (TETA), tetraethylene pentamine (TEPA) and methane diamine (MDA).

In addition, the aromatic polyamine-based curing agent may include, for example, one or more types selected from the group consisting of meta-phenyldiamine (MPDA), diamino diphenylsulfone (DDS) and diphenyl diaminomethane (DDM).

In addition, the acid anhydride-based curing agent may include, for example, one or more types selected from the group consisting of phthalic anhydride (PA), teterahydrophthalic anhydride (THPA), methyl tetrahydrophthalic anhydride (MTHPA), hexahydrophthalic anhydride (HHPA) and methyl nadic anhydride (MNA).

In addition, the catalytic curing agent may include, for example, one or more types selected from the group consisting of catalytic curing agents including one or more types selected from the group consisting of dicyandiamide (DICY), melamine, polymercaptan, methylene diphenyldiisocyanate (MDI), toluene diisocyanate (TDI), BF3 monoethylene amine (BF3-MEA), benzyl dimethylamine (BDMA) and phenyl imidazole.

Meanwhile, according to an exemplary embodiment of the present invention, when the compound represented by Formula 1 is included as the subject resin, the coating layer-forming component may include a first curing agent including an aliphatic polyamine-based curing agent and a second curing agent including one or more types selected from the group consisting of an aromatic polyamine-based curing agent, an acid anhydride-based curing agent and a catalytic curing agent as curing agents. Therefore, there are advantages in enhancement of compatibility with an insulating heat dissipation filler to be described, and particularly, silicon carbide, all physical properties such as an adhesiveness, durability and surface quality of the insulating heat dissipation coating layer, and further prevention of cracks or peeling occurring in the insulating heat dissipation coating layer formed in a corresponding region when a surface to which the heat dissipation coating composition will be applied is not even but curved or has steps.

In addition, to express more enhanced physical properties, preferably, the curing agent may include the first curing agent and the second curing agent at a weight ratio of 1:0.5 to 1.5, and preferably 1:0.6 to 1.4. If the weight ratio of the first curing agent to the second curing agent is less than 1:0.5, the adhesive strength to an adherent may be reduced, and if the weight ratio of the first curing agent to the second curing agent is more than 1:1.5, elasticity of a film may be degraded, and durability may be poor.

In addition, the coating layer-forming component may include the curing agent at 25 to 100 parts by weight, and preferably 40 to 80 parts by weight with respect to 100 parts by weight of the subject resin. If the curing agent is included at less than 25 parts by weight, the resin may not be cured, or the durability of the formed insulating heat dissipation coating layer may be degraded. In addition, when the curing agent is included at more than 100 parts by weight, a crack may be generated in the formed insulating heat dissipation coating layer, or the insulating heat dissipation coating layer may be broken.

Next, an insulating heat dissipation filler will be described.

The insulating heat dissipation filler can employ any material having both insulating property and a heat dissipation property without limitation. In addition, there is no limitation to the shape and size of the insulating heat dissipation filler, and thus the insulating heat dissipation filler may have a porous or non-porous structure. The structure may vary depending on purpose, and the present invention is not particularly limited thereto. In one example, the insulating heat dissipation filler may include one or more types selected from the group consisting of silicon carbide, magnesium oxide, titanium dioxide, aluminum nitride, silicon nitride, boron nitride, aluminum oxide, silica, zinc oxide, barium titanate, strontium titanate, beryllium oxide, manganese oxide, zirconium oxide and boron oxide. However, to easily attain desired physical properties, for example, excellent insulation and heat dissipation performance, easy formation of the insulating heat dissipation coating layer, uniform insulation and heat dissipation performance after the insulating heat dissipation coating layer is formed, and surface quality of the insulating heat dissipation coating layer, the insulating heat dissipation filler is preferably silicon carbide.

In addition, the insulating heat dissipation filler may be a filler which has a surface modified with a functional group such as a silane group, an amino group, an amine group, a hydroxyl group or a carboxyl group. Here, the functional group may directly bind to the surface of the filler, or may indirectly bind to the filler via a substituted or unsubstituted C1 to C20 aliphatic hydrocarbon, or a substituted or unsubstituted C6 to C14 aromatic hydrocarbon.

In addition, the insulating heat dissipation filler may be a core-shell type filler in which a known conductive heat dissipation filler made of a carbon-based material or a metal is included as a core, and the core is surrounded by an insulating component.

In addition, the insulating heat dissipation filler may have an average particle diameter of 10 nm to 15 μm, and preferably 30 nm to 12 μm. If the average particle diameter is less than 10 nm, production costs may be increased, and heat dissipation performance may be degraded due to an increased amount of the insulating heat dissipation filler leaked to a surface after the insulating heat dissipation coating layer is implemented. In addition, if the average particle diameter is more than 15 μm, surface uniformity may be degraded. Meanwhile, to enhance the dispersibility of the insulating heat dissipation filler, a D50/D97 ratio of the included insulating heat dissipation filler may be 1:4.5 or less, and preferably 1:1.2 to 3.5. If the D50/D97 ratio exceeds 1:4.5, surface uniformity may be degraded, a heat dissipation effect may not be uniformly exhibited due to poor dispersibility of the heat dissipation filler, and since particles having a relatively large particle size are included, thermal conductivity may be relatively high, but a desired heat dissipation property may not be exhibited. The D50 and D97 mean particle sizes of the insulating heat dissipation filler at a cumulative volume of 50% and 97% in cumulative volume-particle size distributions, respectively. Specifically, in the graph (particle diameter distribution based on volume) given by the X axis (particle diameter) and the Y axis (frequencies of volume cumulation shown from the smallest particle diameter side), with respect to the total cumulative volume (100%) of all particles, particle diameters corresponding to cumulative values of volume % from the smallest particle diameter of 50% and 97% are D50 and D97, respectively. Cumulative volume-particle size distributions of the insulating heat dissipation filler may be measured using a laser differential scattering particle size distribution device.

Meanwhile, the insulating heat dissipation filler may be used by changing a particle diameter according to a coating thickness of the insulating heat dissipation coating layer to be formed. For example, when the insulating heat dissipation coating layer is formed to a thickness of 25 μm, a heat dissipation filler having an average particle diameter 1 to 7 μm may be used, and when an insulating heat dissipation coating layer having a thickness of 35 μm is formed, a heat dissipation filler having an average particle diameter of 8 to 12 μm may be used. However, to further enhance the dispersibility of the heat dissipation filler in the composition, an insulating heat dissipation filler satisfying the range of an average particle diameter and the range of the D50-to-D97 ratio of the heat dissipation filler according to the present invention is preferably used.

The insulating heat dissipation filler may be included at 25 to 70 parts by weight, and preferably 35 to 60 parts by weight, with respect to 100 parts by weight of the above-described subject resin to exhibit more enhanced physical properties. If the insulating heat dissipation filler is included at less than 25 parts by weight with respect to 100 parts by weight of the subject resin, heat dissipation performance may not be exhibited at a desired level. In addition, if the insulating heat dissipation filler is more than 70 parts by weight, an adhesive strength of the implemented insulating heat dissipation coating layer may be reduced so that peeling easily occurs, and hardness of the insulating heat dissipation coating layer may be increased and thus it may be easily cracked or broken by a physical impact. In addition, as an amount of the heat dissipation filler projecting from the surface of the insulating heat dissipation coating layer is increased, surface roughness is increased, and therefore the surface quality of the insulating heat dissipation coating layer may be degraded. Moreover, although an insulating heat dissipation filler is further included, a degree of enhancement in heat dissipation performance may be insignificant. In addition, in a process of treating a surface to be coated with a heat dissipation coating composition to implement a thin insulating heat dissipation coating layer, during coating by a partial coating method, for example, spraying, it may be difficult to uniformly treat the surface to be coated with the composition, and due to reduced dispersibility of the heat dissipation filler dispersed in the composition, even if the surface to be coated is treated with the composition, the heat dissipation filler may be non-uniformly dispersed. For this reason, it may be difficult to exhibit uniform insulation and heat dissipation performance all over the surface of the insulating heat dissipation coating layer.

In the above-described insulating heat dissipation coating composition, a physical property-enhancing component may be further included. The physical property-enhancing component exhibits more enhanced insulating property/heat dissipation than when the surface to be coated is coated with the insulating heat dissipation coating composition according to the present invention, and also exhibits excellent adhesiveness to be responsible for enhancing durability. The physical property-enhancing component may be a known silane-based compound employed in the art without limitation. However, in order to significantly exhibit durability and a heat dissipation property due to a synergistic action of desired physical properties if the physical property-enhancing component is used with the subject resin of the above-described coating layer-forming component and the insulating heat dissipation filler, particularly, silicon carbide, the physical property-enhancing component may include any one or more selected from the group consisting of 3-[N-anil-N-(2-aminoethyl)] aminopropyltrimethoxysilane, 3-(N-anil-N-glycidyl)aminopropyltrimethoxysilane, 3-(N-anil-N-methacryloyl]aminopropyltrimethoxysilane, 3-glycidyl oxypropylmethylethoxysilane, N,N-bis[3-(trimethoxysilyl)propyl]methacrylamide, γ-glycidoxytrimethyldimethoxysilane, 3-glycidyloxypropyltrimethoxysilane, 3-glycidyloxypropyltriethoxysilane, 3-glycidyloxypropylmethylmethoxysilane, 3-(3,4-epoxy cyclohexyl)ethyltrimethoxysilane, 3-methacryloxypropyltrimethoxysilane, 3-glycidoxypropylmethyldimethoxysilane, heptadecafluorodecyltrimethoxysilane, 3-methacryloxypropylmethyldimethoxysilane, 3-methacryloxypropyltris(trimethylsiloxy)silane, methyltris(dimethylsiloxy)silane, 3-aminopropyltriepoxysilane, 3-mercaptopropyltrimethoxysilane and N-(β-aminoethyl)-γ-aminopropyltrimethoxysilane.

In addition, the physical property-enhancing component is preferably included at 0.5 to 20 parts by weight with respect to 100 parts by weight of the subject resin. If the physical property-enhancing component is included at less than 0.5 part by weight, desired physical properties such as enhanced heat dissipation and adhesiveness by the physical property-enhancing component may not be achieved to desired levels. In addition, when the physical property-enhancing component is included at more than 20 parts by weight, the adhesive strength to the surface to be coated may be reduced.

Meanwhile, the above-described insulating heat dissipation coating composition may further include a colorant for minimizing color loss by light, air, moisture or extreme temperature or realizing a desired color, and a quencher for eliminating light to exhibit the stability of the surface of a film.

The colorant may be a known dye or pigment. The pigment may be, for example, an organic pigment and/or an inorganic pigment, wherein the inorganic pigments may include a chromate such as chrome yellow, molybdate or zinc chromate; an oxide such as titanium dioxide, iron oxide, zinc oxide or chromium oxide; a hydroxide such as iron oxide sulfur or aluminate white, or other inorganic pigments such as Prussian blue or carbon black. The organic pigments may be divided into two categories: azo pigments which are mainly yellow to red pigments; and phthalocyanine pigments which are mainly blue to green pigments, and other than these, may include metal complex salt pigments, condensed polycyclic pigments such as anthraquinone, thioindigo, perinone, perylene, quinacridone, dioxazine, quinophthalone and isoindolinone pigments, nitro pigments, nitroso pigments, alkali blue and aniline black. The pigment may be suitably controlled in content by considering a specific type and color intensity of the pigment according to a color to be realized, and may be included at, for example, 10 to 60 parts by weight, and preferably, 35 to 55 parts by weight with respect to 100 parts by weight of the subject resin, but the present invention is not limited thereto.

In addition, the quencher may include one or more types selected from the group consisting of titanium dioxide, aerogel silica, hydrogel silica, PP wax, PE wax, PTFE wax, a urea formaldehyde resin and a benzoguanamine formaldehyde resin, and preferably titanium dioxide. In addition, the quencher may be included at 30 to 60 parts by weight, and preferably 35 to 55 parts by weight with respect to 100 parts by weight of the subject resin, but the present invention is not limited thereto.

Talc which can be used as the colorant and titanium dioxide which can be used as the quencher may be used as fillers along with the insulating heat dissipation filler to enhance voltage resistance.

Meanwhile, the above-described insulating heat dissipation coating composition may further include a flame retardant to enhance flame resistance of the insulating heat dissipation coating layer.

As the flame retardant, a known component employed as a flame retardant in the art may be used. As an example, the flame retardant may include one or more types selected from the group consisting of trizinc bis(orthophosphate), triphenyl phosphate, trixylenyl phosphate, tricresyl phosphate, triisophenyl phosphate, tris-choloroethylphosphate, trischloroprophyphosphate, resorcinol diphosphate, aromatic polyphosphates, polyphosphoric acid ammonium and red phosphorous. In addition, the flame retardant may be included at 10 to 35 parts by weight, and preferably 15 to 30 parts by weight with respect to 100 parts by weight of the subject resin.

Meanwhile, the above-described insulating heat dissipation coating composition may further include a dispersant and a solvent, which enhance the dispersibility of the insulating heat dissipation filler and realize a uniform insulating heat dissipation coating layer.

As the dispersant is a dispersant of an insulating heat dissipation filler, a known component employed in the art may be used. As an example, the dispersant may be a silicone-based dispersant, a polyester-based dispersant, a polyphenylene ether-based dispersant; a polyolefin-based dispersant, an acrylonitrile-butadiene-styrene copolymer dispersant, a polyacrylate-based dispersant, a polyamide-based dispersant, a polyamideimide-based dispersant, a polyarylsulfone-based dispersant, a polyetherimide-based dispersant, a polyethersulfone-based dispersant, a polyphenylene sulfide-based dispersant, a polyimide-based dispersant, a polyetherketone-based dispersant, a polybenzoxazole-based dispersant, a polyoxadiazole-based dispersant, a polybenzothiazole-based dispersant, a polybenzimidazole-based dispersant, a polypyridine-based dispersant, a polytriazole-based dispersant, a polypyrolidine-based dispersant, a polydibenzofuran-based dispersant, a polysulfone-based dispersant, a polyurea-based dispersant, a polyurethane-based dispersant, or a polyphosphazene-based dispersant, which may be used independently or in a mixture or copolymer of two or more selected therefrom. In addition, as an example, the dispersant may be a silicone-based dispersant.

In addition, the dispersant is preferably included at 0.5 to 20 parts by weight with respect to 100 parts by weight of the insulating heat dissipation filler. If the dispersant is included at less than 0.5 part by weight with respect to 100 parts by weight of the insulating heat dissipation filler, desired effects may not be exhibited, and if the dispersant is more than 20 parts by weight, the adhesive strength to an adherent may be reduced or pin holes and orange peels may occur on the surface of a film.

In addition, the solvent may be selected according to the subject resin or curing agent used herein, but the present invention is not particularly limited thereto, and may be a random solvent capable of suitably dissolving each component, for example, one or more types selected from the group consisting of an aqueous solvent such as water, an alcoholic solvent, a ketone-based solvent, an amine-based solvent, an ester-based solvent, an amide-based solvent, a halogenated hydrocarbon-based solvent, an ester-based solvent and a furan-based solvent.

Meanwhile, the above-described insulating heat dissipation coating composition may further include an UV stabilizer to prevent yellowing caused by UV.

As the UV stabilizer, a known component employed in the art as an UV stabilizer of an insulating heat dissipation coating composition may be used. As an example, the UV stabilizer may include any one or more selected from the group consisting of 2-(2'-hydroxy-3,5'-di(1,1-dimethylbenzyl-phenyl)-benzotriazole, 2-(2'-hydroxy-3',5'-di-tert-butylphenyl)-benzotriazole, 2-(2'-hydroxy-3'-terbutyl-5'-methylphenyl)-5-chloro-benzotriazole, 2-(2-hydroxy-5-tert-octylphenyl)-benzotriazole, 2-(5-methyl-2-hydroxy-phenyl)-benzotriazole, 2,6-di-t-butyl-4-methylphenol, tetrakis [methylene-3-(3,5-di-t-butyl-4-hydroxyphenyl)propionate]methane, octadecyl-3,5-di-t-butyl-4-hydroxyhydrocinnamate, 2,2-methylene bis(4-methyl-6-t-butylphenol), tris(2,4-di-t-butylphenyl)-phosphite, bis(2,4-di-t-butyl), pentaerythritol-di-phosphite alkylester phosphites, dilauryl thio-di-propionate, di-stearyl thio-di-propionate and dimyristyl thio-di-propionate. In addition, as an example, the UV stabilizer may be 2-(2'-hydroxy-3,5'-di(1,1-dimethylbenzyl-phenyl)-benzotriazole.

In addition, the UV stabilizer is preferably further included at 0.05 to 2 parts by weight with respect to 100 parts by weight of the subject resin. If the UV stabilizer is included less than 0.05 part by weight with respect to 100 parts by weight of the subject resin, desired effects may not be exhibited, and if the UV stabilizer is included more than 2 parts by weight, the adhesive strength and impact resistance of the insulating heat dissipation coating layer may be reduced.

Meanwhile, the above-described insulating heat dissipation coating composition may further include an antioxidant to prevent discoloration of a dry film, and degradation of physical properties such as brittleness caused by oxidation, an adhesive strength, etc.

As the antioxidant is an antioxidant of an insulating heat dissipation coating composition, a known component employed in the art may be used. As an example, the antioxidant may include any one or more selected from the group consisting of tri-methylphosphate, tri-phenylphosphate, tris(2,4-di-tert-butylphenyl)phosphate, triethylene glycol-bis-3-(3-tert-butyl-4-hydroxy-5-methylphenyl)propionate, 1,6-hexane-diol-3(3,5-di-tert-butyl-4-hydroxyphenyl)propionate, pentaerythrityl-tetrakis(3-(3,5-di-tert-butyl-4-hydroxyphenyl)propionate, 2-hydroxybenzophenone, 2-hydroxyphenylbenzothiazole, a hindered amine, an organic nickel compound, salicylate, a cinnamate derivative, resorcinol monobenzoate, oxanilide and p-hydroxybenzoate. In addition, as an example, the antioxidant may be 2-hydroxyphenylbenzothiazole.

In addition, the antioxidant is preferably further included at 0.1 to 3 parts by weight with respect to 100 parts by weight of the subject resin. If the antioxidant is included at less than 0.1 part by weight with respect to 100 parts by weight of the subject resin, discoloration may occur, and if the antioxidant is included at more than 3 parts by weight with respect to 100 parts by weight of the subject resin, brittleness and adhesive strength may be degraded.

In addition, the above-described insulating heat dissipation coating composition may also include, other than the above-described components, one or two or more of various additives such as a leveling agent, a pH adjuster, an ion-sequestering agent, a viscosity adjuster, a thixotropic agent, a thermal stabilizer, a photostabilizer, a UV absorbent, a dehydrating agent, an antistatic agent, an anti-mold agent, and a preservative. The above-mentioned various types of additives may include those known in the art, but the present invention is not particularly limited.

The insulating heat dissipation coating composition according to an exemplary embodiment of the present invention may have a viscosity of 5 to 600 cps at 25° C. If the viscosity of the insulating heat dissipation coating composition is less than 5 cps, due to downward flow of the composition, it may be difficult to form an insulating heat dissipation coating layer, and then the adhesive strength to a surface to be coated may be reduced, and if the viscosity of the insulating heat dissipation coating composition is more than 600 cps, it may be difficult to form an insulating heat dissipation coating layer having a small thickness, even though the layer is formed, the surface may not be even, a coating process may not be easy, and particularly, in the case of spraying, the coating process may be more difficult. In addition, dispersibility of the insulating heat dissipation filler in the insulating heat dissipation coating layer may be reduced.

Meanwhile, the insulating heat dissipation coating composition according to an exemplary embodiment of the present invention may have a thermal emissivity of 10% or more, assessed by a method of evaluating thermal emission as follows.

Specifically, the method of evaluating thermal emission is for measuring thermal emissivity according to Mathematical Formula 1 below, in a closed system under conditions of 25° C. and a humidity of 50%, by measuring a temperature at a site 5 cm above the center of the heat dissipation unit after a heat source having a surface area of 4 cm² and a temperature of 88° C. is placed to be in contact with the bottom center of a heat dissipation unit including an insulating heat dissipation coating layer having a thickness of 25 µm, which is formed by treating the top surface of an aluminum plate having a thickness of 1.5 mm and a size of 35 mm×34 mm (width×length) with the insulating heat dissipation coating composition, and measuring a temperature only on an aluminum plate which does not have a heat dissipation coating layer by the same method as described above. Here, the closed system may be an acryl chamber having a size of 32 cm×30 cm×30 cm (width×length×height), and the heat dissipation unit may be placed in the center of the closed system. In addition, the heat source may be any heat source that is controlled in temperature up to a predetermined degree and continuously maintained at the corresponding temperature without limitation, and may be, for example, an LED having a predetermined consumption power.

[Mathematical Formula 1]

Heat emissivity (%) =

$$\left\{ \left( \frac{\text{Temperature at site 5 cm above the center of heat dissipation unit (° C.)}}{\text{Temperature at site 5 cm above the center of non-coated heat dissipation unit (° C.)}} \right) - 1 \right\} \times 100(\%)$$

The high thermal emissivity calculated according to Mathematical Formula 1 means that the thermal emissivity is excellent such that heat can rapidly radiate into the air. The insulating heat dissipation coating composition according to an exemplary embodiment of the present invention preferably has a thermal emissivity of 30% or more, and more preferably 80% or more, which are calculated according to the above-described Mathematical Formula 1, showing that the thermal emissivity is very excellent.

Meanwhile, the present invention, as shown in FIG. 1, includes a heat dissipation unit 100 which includes a base 10a and an insulating heat dissipation coating layer 10b formed by applying the insulating heat dissipation coating composition according to the present invention to at least a part of the outer surface of the base 10a.

The base 10a may be employed without limitation if the insulating heat dissipation coating composition according to the present invention is applied, functionally, regardless of a heat dissipation property and thus has mechanical strength to such an extent that a coating layer can be formed. For this reason, a material for the base 10a may be any one or more of a metal, a non-metal and a polymer organic compound. The metal may be formed of any one metallic material selected from the group consisting of aluminum, copper, zinc, silver, gold, iron, an oxide thereof and an alloy thereof. In addition, the non-metal may be a component commonly referred to as an aluminum oxide, typically, ceramic. In addition, the polymer organic compound may be a polymer organic compound commonly referred to as polyethylene, polypropylene, polystyrene, polyvinylchloride, an acrylonitrile-butadiene-styrene (ABS) resin, an acrylonitrile-styrene (AN) resin, a methacryl resin (PMMA), a polyamide, a polyacetal, a polycarbonate, polyethylene terephthalate (PET), polybutylene terephthalate (PBT), a fluorine resin, a phenoxy resin, a phenol resin (PE), an urea resin (UF), a melamine resin (MF), a unsaturated polyester resin (UP), an epoxy resin, and a polyurethane resin.

Figure 2:
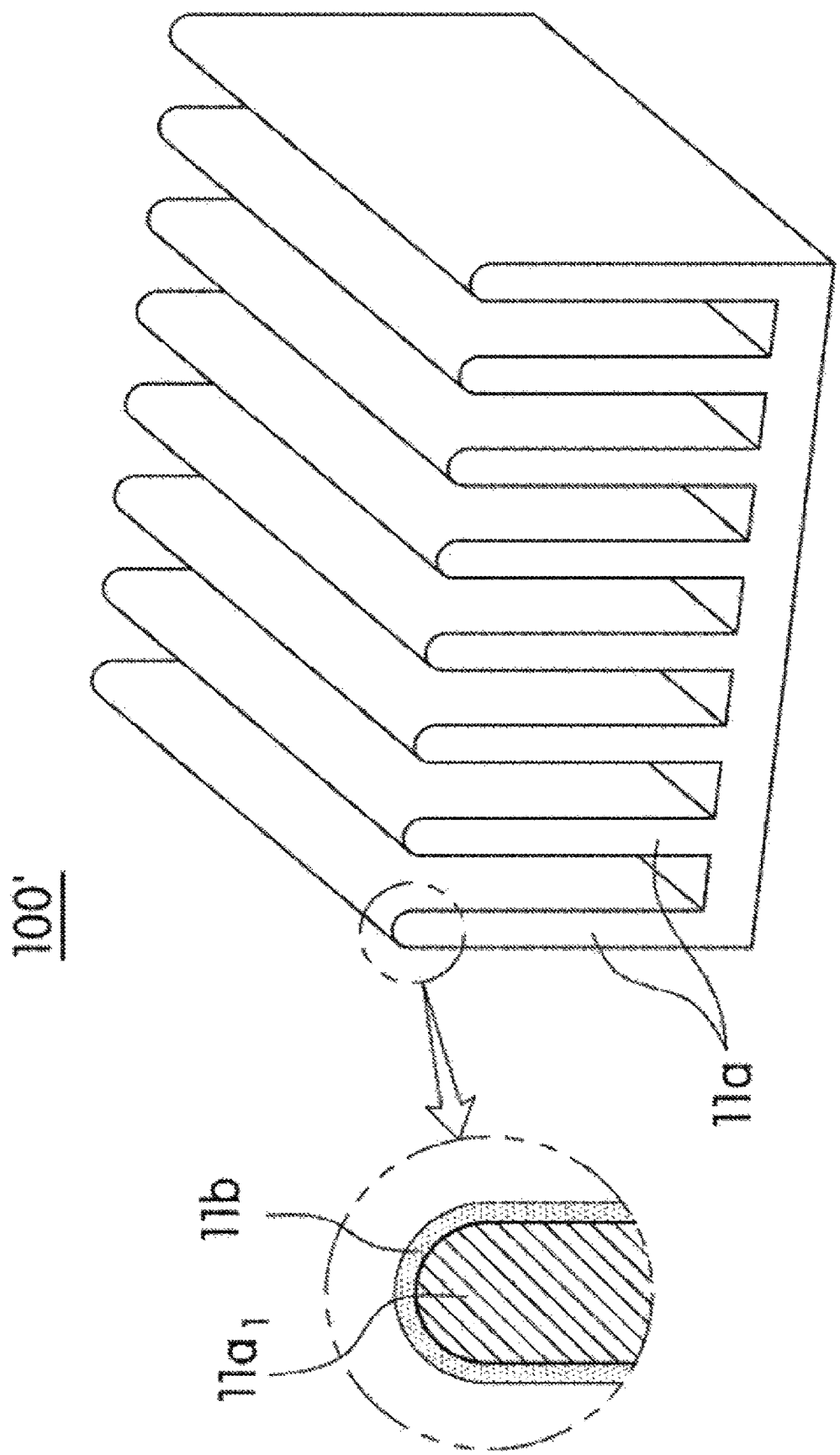
Figure 3:
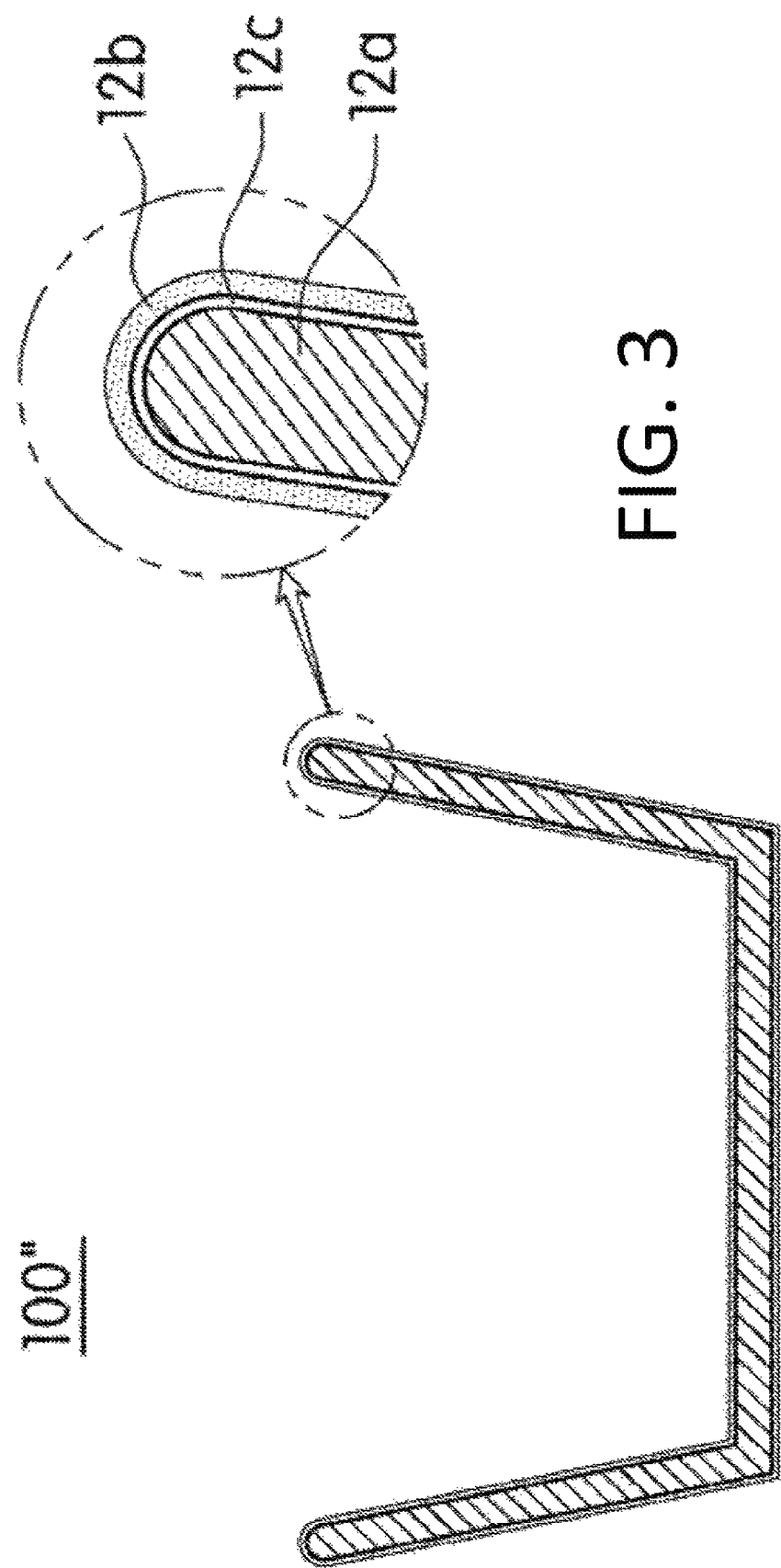

There is no limitation to a shape of the base 10a. When the base 10a is a base having a heat dissipation property, the base 10a may have a structure including a plurality of needle-like cooling fins $10a_1$ as shown in FIG. 1 in order to expand a surface area for thermal emission to the outside. Alternatively, as shown in FIG. 2, the base 10a may have a structure including plate-like cooling fins $10a_2$. Alternatively, as shown in FIG. 3, the base 12a may have a structure in which both ends of the bottom plate are bent upward to face each other so as to serve as cooling fins. Meanwhile, since insulating heat dissipation coating layers 10b, 11b and 12b formed of the insulating heat dissipation coating composition according to an exemplary embodiment of the present invention exhibit enhanced heat dissipation performance, although a heat dissipation unit 100" shown in FIG. 3 has a smaller number of cooling fins of the base 12a than those of FIGS. 1 and 2, the heat dissipation base may exhibit much higher heat dissipation performance than that formed in the shape shown in FIG. 1 or 2, which is increased in surface area without including an insulating heat dissipation coating layer. Therefore, although not employing the bases 10a and 11a having a structure that is difficult to form and causes an increase in production time and costs as shown in FIGS. 1 and 2, the present invention can achieve heat dissipation performance at a desired level.

In addition, as shown in FIGS. 1 and 2, even though the bases 10a and 11a have a complicated shape including a plurality of cooling fins $10a_1$ and $11a_1$, due to the excellent adhesiveness of the insulating heat dissipation coating layer, the insulating heat dissipation coating layer may not be peeled or cracked even on the outer surface which is bent or has steps.

The thickness, length, and width of the base 10a, la or 12a may vary according to the size or location of a site to which the heat dissipation unit 100, 100' or 100" is included, and the present invention is not particularly limited thereto.

In addition, as shown in FIG. 3, the base 12a may further include a functional layer 12c between the outer surface and the insulating heat dissipation coating layer 12b, and the functional layer may be a separate primer layer for enhancing the adhesiveness of the insulating heat dissipation coating layer 12b or an oxidation film formed by modifying the outer surface of the base 12a by anodizing to enhance heat dissipation performance.

The insulating heat dissipation coating composition according to the present invention is applied to at least a part of the above-described base 10a, 11a or 12a so as to form a heat dissipation coating layer, and unlike FIGS. 1 to 3, the insulating heat dissipation coating layer may be formed on only a part of the base 10a, 11a or 12a. The coated area in the partial coating may vary according to heat dissipation performance at a desired level, and thus the present invention is not particularly limited thereto.

Figure 4:
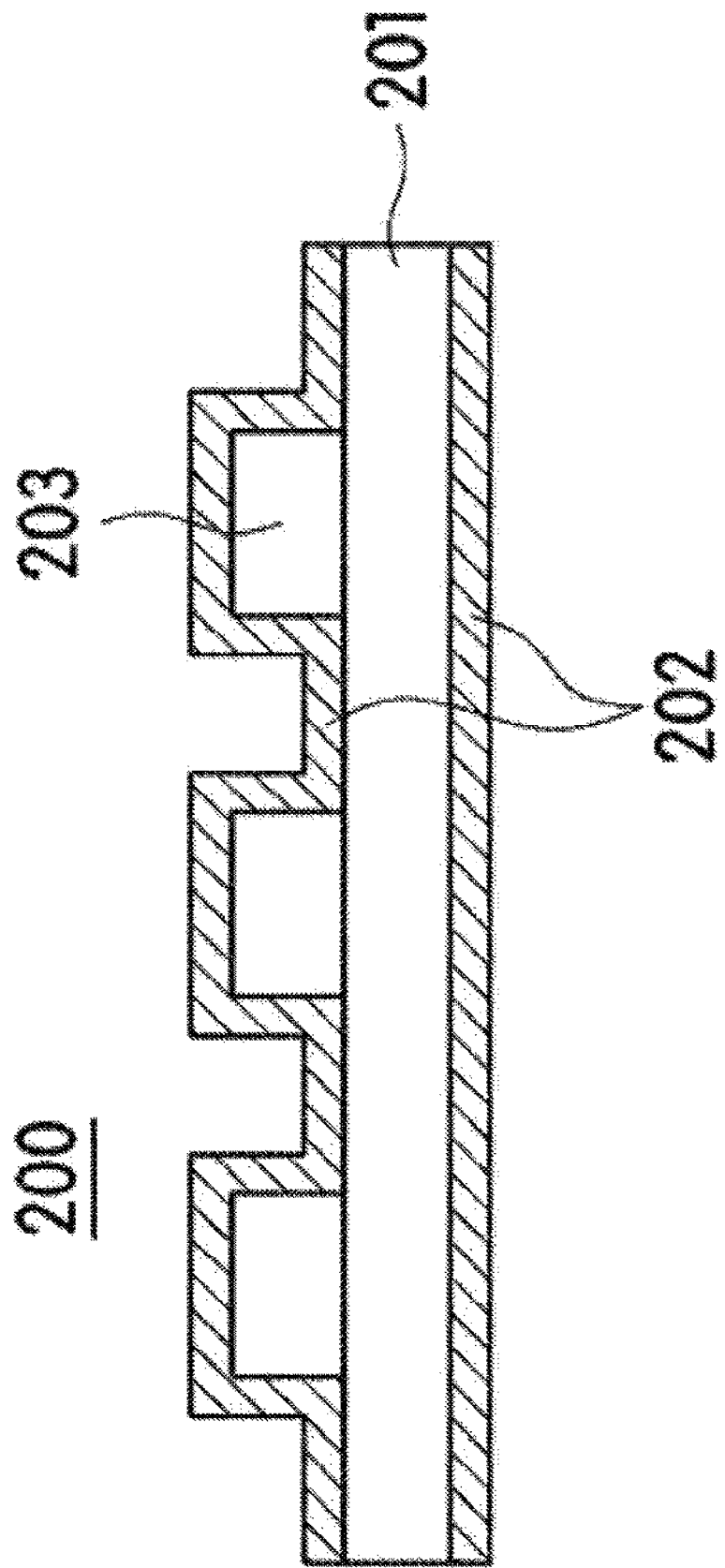
FIGS. 4 and 5 are cross-sectional views illustrating embodiments in which an insulating heat dissipation coating composition according to an exemplary embodiment of the present invention is treated.

In addition, as shown in FIG. 4, the insulating heat dissipation coating composition according to the present invention is applied to at least a part of the outer surface of an element-mounted circuit board, thereby forming an insulating heat dissipation coating layer, resulting in implementation of an insulating heat dissipation circuit board.

Specifically, as shown in FIG. 4, the insulating heat dissipation circuit board 200 may include a plurality of elements 203 mounted on the top surface of a substrate 201, and an insulating heat dissipation coating layer 202 may be formed under the substrate 201 and on the substrate 201 and the plurality of elements 203. The element may be known elements mounted on the circuit board in an electronic device such as a driving chip. In addition, the substrate may be a known circuit board included in an electronic device, for example, a PCB or FPCB. The size and thickness of the substrate can be changed according to the internal design of an electronic device to be implemented, and thus the present invention is not particularly limited thereto.

Figure 5:
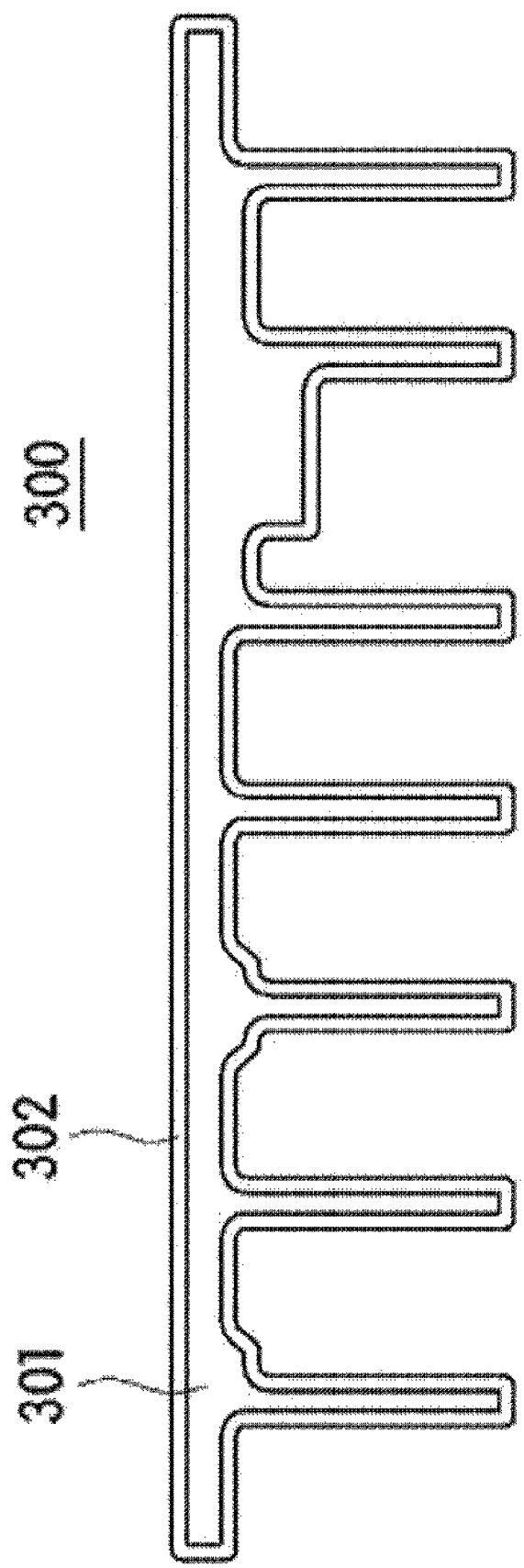

In addition, as shown in FIG. 5, an insulating heat dissipation coating composition according to the present invention is applied to at least a part of the outer surface of a heat sink 301 for lighting, thereby forming an insulating heat dissipation coating layer 302, resulting in implementation of an insulating heat dissipation part for lighting 300.

The heat sink may be a known heat sink included in lighting. The material, size, thickness and shape of the heat sink can be changed according to the use, shape and internal design of lighting to be implemented, and the present invention is not particularly limited thereto.

Meanwhile, the insulating heat dissipation coating composition according to the present invention may be applied to electronic device parts including mobile devices, TVs, wearable devices and flexible devices, automobile parts including LED lamps, electronic control units (ECUs), EV batteries and inverters, telecommunication devices including RF equipment, digital equipment, server devices and set-up boxes, network devices, devices including solar cell panels, LEDs and Al/AlN printed circuit boards (PCBs), and lighting parts such as cases and sockets for lighting, in addition to the above-described heat dissipation unit, circuit board and parts for lighting. In one example, the insulating heat dissipation coating composition according to the present invention may be applied to automobile parts including one or more types selected from the group consisting of an insulating heat dissipation busbar for an EV high-voltage switching relay, an insulating heat dissipation case for an EV high-voltage switching relay, an insulating heat dissipation DC-DC converter for automobile, an automobile engine cooling device, an automobile LED head lamp and a PTC heater, which include an insulating heat dissipation coating layer formed by treating at least a part of the outer surface with the insulating heat dissipation coating composition according to the present invention.

In one example, the automobile part may be an insulating heat dissipation busbar for an EV high-voltage relay, which includes the insulating heat dissipation coating layer cured by treating at least a part of the outer surface with the insulating heat dissipation coating composition according to the present invention.

The busbar for an EV high-voltage relay may be a known busbar for an EV high-voltage relay which is commonly used in the art, and the material, size, thickness and shape of the busbar can be changed according to the internal design considering desired input voltage and/or output voltage of an EV high-voltage relay to be realized, but the present invention is not particularly limited thereto.

In addition, the automobile part may be an insulating heat dissipation case for an EV high-voltage switching relay, which includes the insulating heat dissipation coating layer formed by treating at least one part of the outer surface with the insulating heat dissipation coating composition according to the present invention.

The case for an EV high-voltage switching relay may be a known case for an EV high-voltage relay which is commonly used in the art. The case for EV high-voltage switching relay may include the above-described busbar for an EV high-voltage relay, and the material, size, thickness and shape of the case can be changed according to the internal design such as the shape or number of busbars located in an EV high-voltage relay to be realized, and thus the present invention is not particularly limited thereto.

In addition, the automobile part may be an insulating heat dissipation DC-DC converter, which includes the insulating heat dissipation coating layer formed by treating at least a part of the outer surface with the insulating heat dissipation coating composition according to the present invention.

The DC-DC converter serves to convert a DC power source at a specific voltage to a DC power source at a different voltage and may be a known DC-DC converter commonly used in the art. The size and shape of the DC-DC converter can be changed according to the internal design of a device to be realized, and thus the present invention is not particularly limited thereto.

In addition, the automobile part may be an engine cooling device, which includes the insulating heat dissipation coating layer formed by treating at least a part of the outer surface with the insulating heat dissipation coating composition according to the present invention.

In one example, the insulating heat dissipation coating layer may be formed on a part or all of the surface of a radiator included in the engine cooling device. The radiator may be a known radiator which is commonly used in the art, and the material, size and shape of the radiator can be changed according to the internal design of the engine cooling device to be realized, and thus the present invention is not particularly limited thereto.

In addition, the automobile part may be an LED head lamp, which includes the insulating heat dissipation coating layer formed by treating at least a part of the outer surface with the insulating heat dissipation coating composition according to the present invention.

Due to the insulating heat dissipation coating layer included on at least a part of the outer surface of the LED head lamp, insulating and heat dissipating properties may be significantly enhanced, and the weight of the LED head lamp may be lowered. The LED head lamp may be a known LED head lamp which is commonly used in the art, and the material, size and shape of the LED head lamp can be changed according to the design of an automobile to be realized and/or the internal design of the LED head lamp, and thus the present invention is not particularly limited thereto.

In addition, the automobile part may be a PCT heater for electric automobile, which includes the insulating heat dissipation coating layer formed by treating at least a part of the outer surface with the insulating heat dissipation coating composition according to the present invention.

The PTC heater may include PTC fins, and as the insulating heat dissipation coating layer is formed on a part or all of the PTC fins, the consumption power of the electric automobile may be reduced. The PTC fins may be known PTC fins which are commonly used in the art, and the material, size and shape of the PTC fins can be changed according to the internal design of the PTC heater to be realized, and thus the present invention is not particularly limited thereto.

Figure 6:
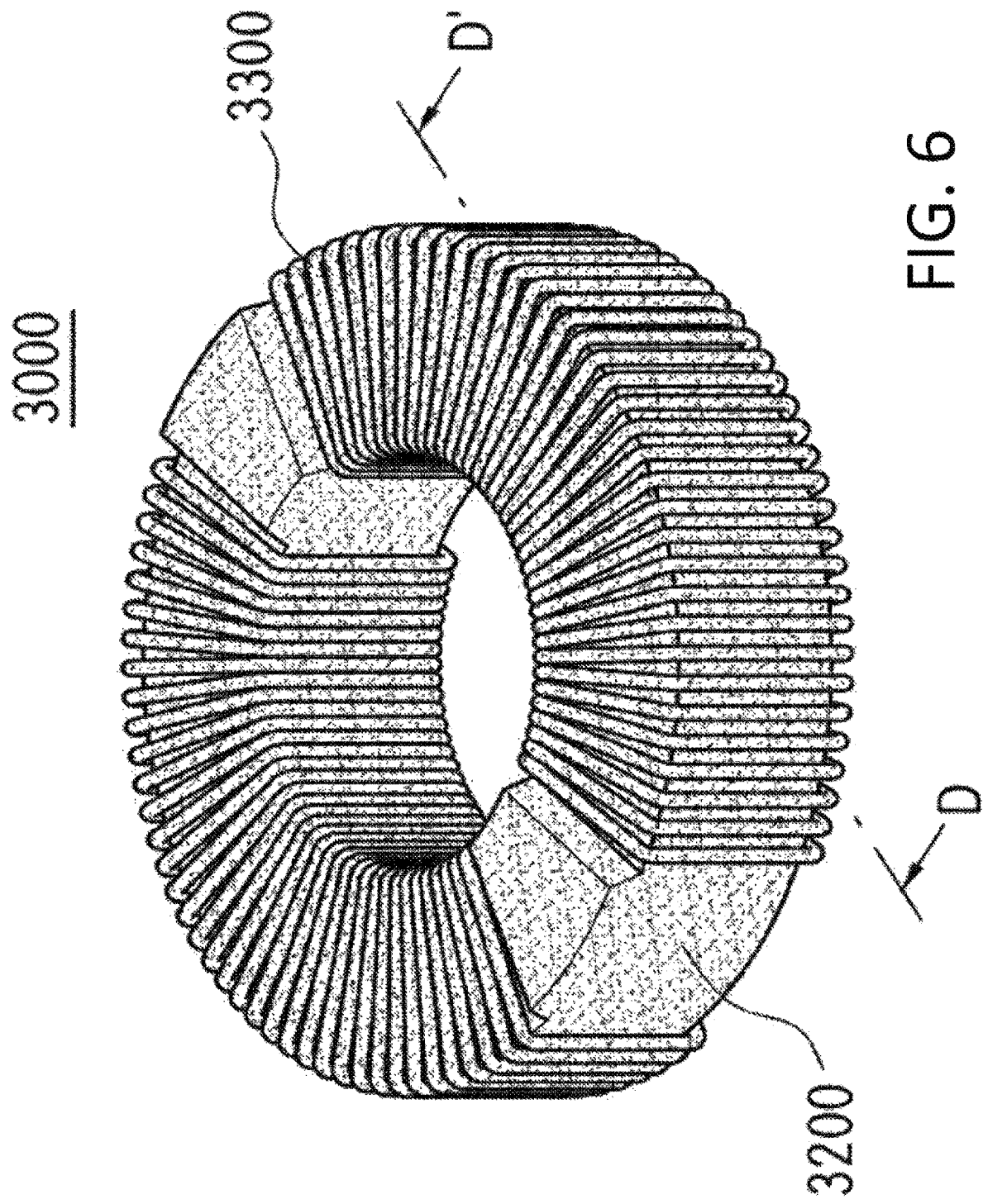

Meanwhile, in one example of the present invention, the insulating heat dissipation coating composition may be applied to a coil part 3000 shown in FIGS. 6 and 7. Specifically, the insulating heat dissipation coating composition including a subject resin 3410 and an insulating heat dissipation filler 3420 may be applied to the outer surface of the entire coil part including an insulating film 3200 formed on the outer surface of a magnetic core 3100 and at least a pair of coils 3300 wound on the outside of the insulating film 3200, thereby forming an insulating heat dissipation coating layer 3400. As a result, it is possible to prevent a problem of short-circuiting or electrical shorts, which may occur when the pair of coils 3300 are electrically connected by a non-insulating heat dissipation coating layer, and excellent heat dissipation performance may be exhibited. Meanwhile, unlike FIGS. 6 and 7, the insulating film is substituted with an insulating heat dissipation coating layer, and thus excellent heat dissipation performance may be exhibited.

The insulating heat dissipation coating layer 10*b*, 11*b* or 12*b* is formed by curing the insulating heat dissipation coating composition according to the present invention on the outer surface of the base. A specific method of forming the insulating heat dissipation coating layer 10*b*, 11*b* or 12*b* may be a known method of coating a base with an insulating heat dissipation coating composition, and as a non-limited example, by spraying, dip coating, silk screening, roll coating, dip coating or spin coating, an insulating heat dissipation coating composition may be applied to various bases, thereby forming the insulating heat dissipation coating layer.

The insulating heat dissipation coating composition used in the present invention forms a film by being in contact with a solid base, particularly, a metal base and exposed to the air to be rapidly cured without stickiness at room temperature or 50° C. or less within several minutes, and therefore, the film has a less possibility of being contaminated by dust or the like in a work place, final curing can be performed at a relatively low temperature such that workability may become excellent and deformation of the metal base may also be prevented in the curing.

The thickness of the formed insulating heat dissipation coating layer 10*b*, 11*b* or 12*b* is preferably 10 to 100 μm, and more preferably, 15 to 50 μm. If the thickness is more than 100 μm, boiling on the coating surface may occur, and if the thickness is less than 10 μm, a heat dissipating property may be degraded.

In addition, the heat dissipation coating composition for forming the insulating heat dissipation coating layer of the present invention may subsequently increase the flexural strength of the coating layer, have an excellent adhesive strength between the coating layer and the base, and enhanced moisture resistance and weather resistance, enhance wettability of an insulating heat dissipation filler, reduce viscosity in compounding, and increase flexibility of the base surface on which the insulating heat dissipation coating layer is formed. In addition, due to an excellent heat dissipating property and excellent insulating property, excellent solvent resistance against an organic solvent, no discoloration during curing, and easy control of thermal conductivity, an insulating heat dissipation unit including the insulating heat dissipation coating layer realized as described above may steadily exhibit enhanced physical properties. Therefore, the heat dissipation coating composition may be widely applied to various types of electronic parts such as a common mode choke, a boost reactor, a differentiation-mode choke, a current transformer, an output reactor, etc., lighting devices such as an LED lamp, etc., power devices such as an energy charging device, a heater, a display device, an engine, a motor, etc., energy storing devices such as a battery, etc., electrical and electronic devices such as a heat exchanger, a condenser, an evaporator, etc., and insulating heat dissipation units or housing for all automobile, energy and aerospace industries, which require both insulating property and a heat dissipating property.

EXAMPLES

The present invention will be described in further detail with reference to the following examples, but the following examples do not limit the scope of the present invention and should be interpreted as helping the understanding the present invention.

Example 1

A coating layer-forming component was prepared by mixing 60 parts by weight of a curing agent including a polyethylene polyamine as a first curing agent and 2,4,6-tris[N,N-dimethylamino]methyl]phenol as a second curing agent in a weight ratio of 1:1, 47 parts by weight of silicon carbide having an average particle diameter of 5 μm and a ratio of D50 to D97 of 1:1.6, 3 parts by weight of an epoxy-based silane compound as a physical property-enhancing component (Shanghai Tech Polymer Technology, Tech-7130), 44 parts by weight of talc as a colorant, 44 parts by weight of titanium dioxide as a quencher, 22 parts by weight of trizinc bis(orthophosphate) as a flame retardant, 0.5 part by weight of 2-(2'-hydroxy-3,5'-di(1,1-dimethylbenzyl-phenyl)-benzotriazole as an UV stabilizer, 1 part by weight of 2-hydroxyphenylbenzothiazole as an antioxidant, 5 parts by weight of a condensate of isobutylaldehyde and urea as a dispersant, and 13 parts by weight of 1-butanol, 13 parts by weight of n-butyl acetate, 13 parts by weight of 2-methoxy-1-methylethyl acetate, 9 parts by weight of methylethylketone, 37 parts by weight of ethyl acetate, 9 parts by weight of toluene, 43 parts by weight of 4-methyl-2-pentanone, and 103 parts by weight of xylene as solvents with respect to 100 parts by weight of a compound represented by Formula 1 below as a subject resin and stirring the mixture. After stirring, bubbles included in the mixture were removed to have the final viscosity of 100 to 130 cps at 25° C., thereby preparing an insulating heat dissipation coating composition shown in Table 1 below, and then the composition was stored at 5° C.

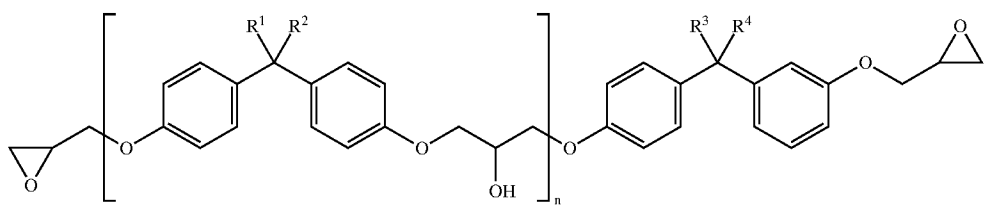

[Formula 1]

$R^1$ to $R^4$ are each independently a methyl group, and n is a rational number such that the compound represented by Formula 1 has a weight average molecular weight of 2000.

Examples 2 to 23

Insulating heat dissipation coating compositions shown in Tables 1, 2, 3 or 4 were prepared in the same manner as described in Example 1, except that an average particle diameter or particle size distribution of an insulating heat dissipation filler, a weight ratio of curing agents, or the molecular weight of a subject resin was changed as shown in Table 1, 2, 3 or 4.

Comparative Example 1

Insulating coating compositions were prepared in the same manner as described in Example 1, except that an insulating heat dissipation filler is not included as shown in Table 4 below.

Experimental Example 1

Each of the heat dissipation coating compositions prepared in the examples and the comparative examples was spray-coated onto the entire surface of a base which was formed of aluminum (Al 1050) and had a thickness of 1.5 mm and a size of 35 mm×34 mm (width×length) to the final thickness of 25 μm and thermally treated at 150° C. for 10 minutes, thereby manufacturing a heat dissipation unit on which an insulating heat dissipation coating layer was formed, and then physical properties as below were evaluated and shown in Tables 1 to 4.

1. Evaluation of Thermal Conductivity

A heat dissipation unit was placed in the middle of an acryl chamber having a size of 32 cm×30 cm×30 cm (width×length×height), and then a temperature in the chamber and a temperature of the heat dissipation unit were controlled to 25±0.2° C. Subsequently, a test specimen was prepared by adhering an LED having a size of 20 mm×20 mm (width×length) as a heat source to the heat dissipation unit using a thermal conductivity tape (TIM: 1 W/mk). Thermal conductivity was evaluated by generating heat by applying an input power of 2.1 W (DC 3.9V, 0.53 A) to the heat source of the prepared specimen, maintaining the heat for 90 minutes and measuring a temperature of the heat dissipation unit. Specifically, thermal conductivity was calculated according to Mathematical Formula 2 based on a temperature of a base without a heat dissipation coating layer, which was measured under the same conditions.

[Mathematical Formula 2]

$$\text{Thermal conductivity (\%)} = \left\{1 - \left(\frac{\text{Temperature of test specimen (° C.)}}{\text{Temperature of non-coated base (° C.)}}\right)\right\} \times 100(\%)$$

2. Evaluation of Thermal Emissivity

A heat dissipation unit was placed in the middle of an acryl chamber having a size of 32 cm×30 cm×30 cm (width×length×height), and then a temperature in the chamber and a temperature of the heat dissipation unit were controlled to 25±0.2° C. Subsequently, a test specimen was prepared by adhering an LED having a size of 20 mm×20 mm (width×length) as a heat source to the heat dissipation unit using a thermal conductivity tape (TIM: 1 W/mk). An input power of 2.1 W (DC 3.9V, 0.53 A) was applied to the heat source of the prepared specimen and then maintained. Ninety minutes later, a temperature at a site 5 cm above the center of the heat dissipation unit was measured, and a temperature of the comparative specimen which is a heat dissipation unit without an insulating heat dissipation coating layer, was measured by the same method as described above after 90 minutes, so as to calculate heat dissipation efficiency according to Mathematical Formula 1 below.

[Mathematical Formula 1]

Heat emissivity (%) =

$$\left\{\left(\frac{\text{Temperature at site 5 cm above the center of heat dissipation unit (° C.)}}{\text{Temperature at site 5 cm above the center of non-coated heat dissipation unit (° C.)}}\right) - 1\right\} \times 100\,(\%)$$

3. Evaluation of Uniformity of Heat Dissipation Performance

A heat dissipation unit was placed in the middle of an acryl chamber having a size of 32 cm×30 cm×30 cm (width×length×height), and then a temperature in the chamber and a temperature of the heat dissipation unit and a humidity in the chamber were controlled to 25±0.2° C. and 50%. Subsequently, a test specimen was prepared by adhering an LED having a size of 20 mm×20 mm (width×length) as a heat source to the heat dissipation unit using a thermal conductivity tape (TIM: 1 W/mk). The deviation of a rising temperature was calculated according to Mathematical Formula 3 by generating heat by applying an input power of 2.1 W (DC 3.9V, 0.53 A) to the heat source of the prepared specimen, maintaining the heat for 90 minutes, measuring a temperature at 10 random points on a circle having a radius of 15 mm, drawn from the center of the top surface of the heat dissipation unit. The smaller the deviation, the more uniform the heat dissipation performance, which may be interpreted that the dispersibility of a heat dissipation filler in the insulating heat dissipation coating layer is high. The maximum value of the deviation of the rising temperature is shown in the following Table.

[Mathematical Formula 3]

Deviation of rising temperature (%) =

$$\frac{\left(\begin{array}{c}\text{Average temperature at 10}\\\text{random points (° C.)} -\\\text{Temperature at each point (° C.)}\end{array}\right)}{\text{Average temperature of 10 random points (° C.)}} \times 100\,(\%)$$

4. Evaluation of Durability

A heat dissipation unit was placed in a chamber under conditions of 60° C. and a relative humidity of 90%, and 480 hours later, a state of the surface of the heat dissipation unit was visually evaluated. Through the visual evaluation, the existence of cracking or peeling (lifting) of the insulating heat dissipation coating layer was checked, and when there was no crack or peeling, it was represented as ○, and when there was a crack or peeling, it was represented as x.

5. Evaluation of Adhesiveness

A durability-evaluated specimen was cross-cut with a knife at intervals of 1 mm. Afterward, a scotch tape was attached to the cut surface, and then pulled at an angle of 60° to check a state in which the insulating heat dissipation coating layer was peeled. The specimens were evaluated by evaluation criteria according to ISO 2409 (5B: 0%, 4B: 5% or less, 3B: 5 to 15%, 2B: 15 to 35%, 1B: 35 to 65%, 0B: 65% or more).

6. Evaluation of Surface Quality

To confirm the surface quality of the heat dissipation unit, the surface was touched by hand to check if there was unevenness or roughness. When the surface was smooth, it was rated 5, when the area of a rough region was 2% or less of the total area of the outer surface of the heat dissipation unit, it was rated 4, when the area of a rough region was more than 2% and 5% or less of the total area of the outer surface of the heat dissipation unit, it was rated 3, when the area of a rough region was more than 5% and 10% or less of the total area of the outer surface of the heat dissipation unit, it was rated 2, when the area of a rough region was more than 10% and 20% or less of the total area of the outer surface of the heat dissipation unit, it was rated 1, and when the area of a rough region was more than 20% of the total area of the outer surface of the heat dissipation unit, it was rated 0.

TABLE 1

| | | | Example 1 | Example 2 | Example 3 | Example 4 | Example 5 | Example 6 | Example 7 |
|---|---|---|---|---|---|---|---|---|---|
| Coating layer-forming composition | Coating layer-forming component | Subject resin (weight average molecular weight) | 2000 | 2000 | 2000 | 310 | 570 | 3900 | 4650 |
| | | Content of curing agent (parts by weight) | 60 | 60 | 60 | 60 | 60 | 60 | 60 |
| | | Weight ratio of first curing agent to second curing agent | 1:1 | 1:1 | 1:1 | 1:1 | 1:1 | 1:1 | 1:1 |

TABLE 1-continued

| | | | Example 1 | Example 2 | Example 3 | Example 4 | Example 5 | Example 6 | Example 7 |
|---|---|---|---|---|---|---|---|---|---|
| | Insulating heat dissipation filler | Content (parts by weight) | 47 | 35 | 60 | 47 | 47 | 47 | 47 |
| | | Average particle diameter (μm) | 5 | 5 | 5 | 5 | 5 | 5 | 5 |
| | | Ration of D50 to D97 | 1:1.6 | 1:1.6 | 1:1.6 | 1:1.6 | 1:1.6 | 1:1.6 | 1:1.6 |
| Heat dissipation unit layer | Thickness of insulating heat dissipation coating (μm) | | 25 | 25 | 25 | 25 | 25 | 25 | 25 |
| | Thermal conductivity (%) | | 18.27 | 17.65 | 18.34 | 16.91 | 17.02 | 17.13 | 16.54 |
| | Thermal emissivity (%) | | 90 | 81 | 96 | 86 | 88 | 88 | 87 |
| | Deviation of rising temperature (%) | | 0.5 | 0.6 | 0.4 | 0.3 | 0.4 | 0.9 | 4.1 |
| | Adhesiveness | | 5B | 5B | 5B | 0B | 4B | 5B | 5B |
| | Durability | | ○ | ○ | ○ | x | ○ | ○ | ○ |
| | Surface quality | | 5 | 5 | 5 | 5 | 5 | 5 | 5 |

TABLE 2

| | | | Example 8 | Example 9 | Example 10 | Example 11 | Example 12 | Example 13 | Example 14 |
|---|---|---|---|---|---|---|---|---|---|
| Coating layer-forming composition | Coating layer-forming component | Subject resin (weight average molecular weight) | 2000 | 2000 | 2000 | 2000 | 2000 | 2000 | 2000 |
| | | Content of curing agent (parts by weight) | 15 | 30 | 95 | 110 | 60 | 60 | 60 |
| | | Weight ratio of first curing agent to second curing agent | 1:1 | 1:1 | 1:1 | 1:1 | 1:0.2 | 1:0.6 | 1:1.4 |
| | Insulating heat dissipation on filler | Content (parts by weight) | 47 | 47 | 47 | 47 | 47 | 47 | 47 |
| | | Average particle diameter (μm) | 5 | 5 | 5 | 5 | 5 | 5 | 5 |
| | | Ratio of D50 to D97 | 1:1.6 | 1:1.6 | 1:1.6 | 1:1.6 | 1:1.6 | 1:1.6 | 1:1.6 |
| Heat dissipation unit | Thickness of insulating heat dissipation coating layer (μm) | | 25 | 25 | 25 | 25 | 25 | 25 | 25 |
| | Thermal conductivity (%) | | 16.22 | 17.39 | 17.12 | 14.59 | 16.94 | 17.72 | 17.63 |
| | Thermal emissivity (%) | | 88 | 88 | 87 | 87 | 86 | 88 | 89 |
| | Deviation of rising temperature (%) | | 0.5 | 0.5 | 0.5 | 0.5 | 0.4 | 0.5 | 0.5 |
| | Adhesiveness | | 0B | 4B | 4B | 2B | 0B | 5B | 5B |
| | Durability | | x | ○ | ○ | x | x | ○ | ○ |
| | Surface quality | | 2 | 5 | 5 | 1 | 5 | 5 | 5 |

TABLE 3

| | | | Example 15 | Example 16 | Example 17 | Example 18 | Example 19 | Example 20 | Example 21 |
|---|---|---|---|---|---|---|---|---|---|
| Coating layer-forming composition | Coating layer-forming component | Subject resin (weight average molecular weight) | 2000 | 2000 | 2000 | 2000 | 2000 | 2000 | 2000 |
| | | Content of curing agent (parts by weight) | 60 | 60 | 60 | 60 | 60 | 60 | 60 |
| | | Weight ratio of first curing agent to second curing agent | 1:2 | 1:1 | 1:1 | 1:1 | 1:1 | 1:1 | 1:1 |
| | Insulating heat dissipation filler | Content (parts by weight) | 47 | 47 | 47 | 47 | 47 | 47 | 47 |
| | | Average particle diameter (μm) | 5 | 0.005 | 0.42 | 10 | 20 | 3 | 5 |
| | | Ratio of D50 to D97 | 1:1.6 | 1:2.41 | 1:2.08 | 1:1.51 | 1:1.93 | 1:3.08 | 1:4.96 |
| Heat dissipation unit | Thickness of insulating heat dissipation coating layer (μm) | | 25 | 25 | 25 | 25 | 25 | 25 | 25 |
| | Thermal conductivity (%) | | 17.01 | 12.11 | 17.63 | 17.92 | 17.19 | 17.88 | 18.31 |
| | Thermal emissivity (%) | | 88 | 7 | 88 | 91 | 90 | 81 | 39 |
| | Deviation of rising temperature (%) | | 0.5 | 0.5 | 0.5 | 0.4 | 2.8 | 0.8 | 3.9 |
| | Adhesiveness | | 2B | 3B | 5B | 5B | 3B | 4B | 2B |
| | Durability | | x | ○ | ○ | ○ | ○ | ○ | ○ |
| | Surface quality | | 5 | 5 | 5 | 4 | 0 | 4 | 3 |

TABLE 4

| | | | Example 22 | Example 23 | Comparative Example 1[1) |
|---|---|---|---|---|---|
| Coating layer-forming composition | Coating layer-forming component | Subject resin (weight average molecular weight) | 2000 | 2000 | 2000 |
| | | Content of curing agent (parts by weight) | 60 | 60 | 60 |
| | | Weight ratio of first curing agent to second curing agent | 1:1 | 1:1 | 1:1 |
| | Insulating heat dissipation filler | Content (parts by weight) | 15 | 80 | — |
| | | Average particle diameter (μm) | 5 | 5 | — |
| | | Ratio of D50 to D97 | 1:1.6 | 1:1.6 | — |
| Heat dissipation unit | Thickness of insulating heat dissipation coating layer (μm) | | 25 | 25 | 25 |
| | Thermal conductivity (%) | | 14.62 | 18.36 | 4.76 |
| | Thermal emissivity (%) | | 8 | 98 | 2 |
| | Deviation of rising temperature (%) | | 5.3 | 1.0 | 0 |
| | Adhesiveness | | 5B | 3.8 | 5B |
| | Durability | | ○ | x | ○ |
| | Surface quality | | 5 | 1 | 5 |

[1)]Comparative Example 1 represents a composition not including a heat dissipation filler.

As seen from Tables 1 to 4, it can be confirmed that Examples 1, 5 and 6 in which a weight average molecular weight of the subject resin is in the preferable range attain adhesiveness, durability and more uniform heat dissipation performance at the same time, compared with Examples 4 and 7 which did not satisfy the above condition.

In addition, it can be confirmed that Examples 1, 9 and 10 in which the content of the curing agent is within the preferable range of the present invention attain thermal conductivity, durability and adhesiveness at the same time, compared with Examples 8 and 11 which did not satisfy the above condition.

In addition, it can be confirmed that Examples 1, 13 and 14 in which a weight ratio of the first curing agent and the second curing agent was in the preferable range of the present invention attain adhesiveness and durability at the same time, compared with Examples 12 and 15 which did not satisfy the above condition.

In addition, it can be confirmed that Examples 1, 17 and 18 in which an average particle diameter of the insulating heat dissipation filler was in the preferable range of the present invention attain thermal emissivity, thermal conductivity and surface quality at the same time, compared with Examples 16 and 19 which did not satisfy the above condition.

In addition, it can be confirmed that Examples 1 and 20 in which a ratio of D50 to D97 was in the preferable range of the present invention attain dispersibility, surface quality, thermal emissivity and adhesiveness at the same time, compared with Example 21 which did not satisfy the above condition.

In addition, it can be confirmed that, with reference to the content of the heat dissipation filler, Examples 1, 2 and 3 exhibited significantly higher heat dissipation performance and surface quality, compared with Examples 22 and 23.

In addition, it can be confirmed that Comparative Example 1 which did not include the heat dissipation filler exhibited a significantly lower thermal emissivity than Example 1.

Experimental Example 2

Thermal conductivities of the heat dissipation unit (Preparation Example 1) manufactured of the composition of Example 1 and the heat dissipation unit (Comparative Preparation Example 1) manufactured of the composition of Comparative Example 1 among the manufactured heat dissipation units were measured by a steady-state heat flow method, and a relative gain of the thermal conductivity was evaluated according to Mathematical Formula 4. Results are shown in Table 5 below.

Relative gain (%)={(Thermal conductivity of insulating heat dissipation coating layer (Wm$^{-1}$K$^{-1}$)−Thermal conductivity of coating layer without heat dissipating filler (Wm$^{-1}$K$^{-1}$))/Thermal conductivity of coating layer without heat dissipating filler (Wm-K$^{-1}$)}×100  [Mathematical Formula 4]

TABLE 5

| Classification | Preparation Example 1 | Comparative Preparation Example 1 |
|---|---|---|
| Thermal conductivity (W/m · K) | 0.58 | 0.12 |
| Relative gain of thermal conductivity (%) | 383.3 | |

As shown in Table 5, it can be seen that Preparation Example 1 manufactured by including the insulating heat dissipation filler according to the present invention exhibits a significantly higher thermal conductivity than Comparative Preparation Example 1 not including an insulating heat dissipation filler, and therefore exhibits excellent heat dissipating performance.

Experimental Example 3

Resistance values of the insulating heat dissipation units were measured for the heat dissipation units (Preparation Example 1, Preparation Example 2 and Preparation Example 3) manufactured of the compositions of Examples 1, 2 and 3 and the heat dissipation unit (Preparation Example 23) manufactured of the composition of Example 23 among the manufactured heat dissipation units. specifically, the resistance values were measured by a 4-terminal measurement method, and the results are shown in Table 6 below.

TABLE 6

| Classification | Preparation Example 1 | Preparation Example 2 | Preparation Example 3 | Preparation Example 23 |
|---|---|---|---|---|
| Resistance value (Ω/sq.) | $1.3 \times 10^{12}$ | $7.1 \times 10^{13}$ | $9.7 \times 10^{10}$ | $7.1 \times 10^{9}$ |

As shown in Table 6, Preparation Examples 1 to 3 according to the present invention show significantly higher resistance values than Preparation Example 23 which includes a somewhat large amount of an insulating heat dissipation filler, and therefore exhibit excellent insulating performance.

Although exemplary embodiments of the present invention have been described above, the spirit of the present invention is not limited to the exemplary embodiments presented herein, and it will be understood by those of ordinary skill in the art that other exemplary embodiments may be easily suggested by adding, changing, deleting or adding components within the scope of the same idea and also included in the scope of the spirit of the present invention.

The invention claimed is:

1. An insulating heat dissipation coating composition, comprising:
   a coating layer-forming component including a subject resin and a curing agent which is included in an amount of 40 to 80 parts by weight based on 100 parts by weight of the subject resin, wherein the curing agent comprises a first curing agent comprising an aliphatic polyamine-based curing agent comprising polyethylene polyamine, and a second curing agent comprising one or more types selected from the group consisting of an aromatic polyamine-based curing agent, an acid anhydride-based curing agent and a catalytic curing agent, at a weight ratio of 1:0.5 to 1.5 of the first curing agent to the second curing agent;
   an insulating heat dissipation filler included in an amount of 25 to 70 parts by weight based on 100 parts by weight of the subject resin; and
   a pigment in an amount of 10 to 60 parts by weight based on 100 parts by weight of the subject resin,
   wherein the insulating heat dissipation filler comprises silicon carbide, and
   wherein the insulating heat dissipation filler has an average particle diameter of 10 nm to 15 μm and a ratio of D50 to D97 of 1:4.5 or less.

2. The composition of claim 1, wherein the subject resin includes one or more types selected from the group consisting of polyethylene, polypropylene, polystyrene, polyvinyl chloride, a polyacrylonitrile resin, acrylonitrile-butadiene-styrene (ABS), styrene-acrylonitrile (SAN), an acrylic resin, a methacrylic resin, a polyamide, polyester, a polycarbonate, polyphenylene sulfide, a polyamideimide, polyvinylbutyral, polyvinylformal, polyhydroxypolyether, a polyether, polyphthalamide, a phenoxy resin, polyurethane, a nitrile butadiene resin, an urea-based resin (UF), a melamine-based resin (MF), a unsaturated polyester resin (UP), an epoxy resin and a silicone resin.

3. The composition of claim 1, wherein the subject resin includes a compound represented by Formula 1 below:

[Formula 1]

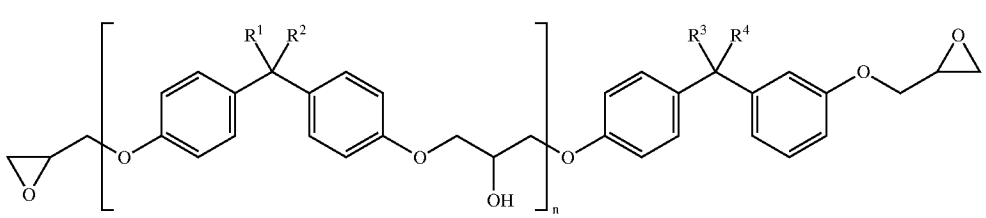

R[1] and R[2] are each independently a hydrogen atom, a C1 to C5 linear alkyl group or a C3 to C5 branched alkyl group, R[3] and R[4] are each independently a hydrogen atom, a C1 to C5 linear alkyl group or a C3 to C5 branched alkyl group, and n is a rational number such that the compound represented by Formula 1 has a weight average molecular weight of 400 to 4000.

4. The composition of claim 1, wherein a thermal emissivity according to the following method of evaluating thermal emission is 30% or more:

In a closed system at 25° C. and a humidity of 50%, a heat dissipation unit including an insulating heat dissipation coating layer having a thickness of 25 μm, formed by treatment with an insulating heat dissipation coating composition is placed on a top surface of an aluminum plate with a thickness of 1.5 mm and a size of 35 mm×34 mm (of width×length) to have a surface area in the middle of the bottom of the dissipation unit of 4 cm², and to be closely adhered to a heat source at 88° C., and after 90 minutes, a temperature is measured at the site 5 cm above the center of the heat dissipation unit, and a temperature is measured only on an aluminum plate on which a heat dissipation coating layer is not formed by the same method as described above to determine thermal emissivity according to Mathematical Formula 1 below:

[Mathematical Formula 1]

$$\text{Heat emissivity (\%)} = \left\{ \left( \frac{\text{Temperature at site 5 cm above the center of heat dissipation unit (° C.)}}{\text{Temperature at site 5 cm above the center of non-coated heat dissipation unit (° C.)}} \right) - 1 \right\} \times 100(\%)$$

* * * * *